United States Patent
Takahashi

(10) Patent No.: US 12,310,183 B2
(45) Date of Patent: May 20, 2025

(54) ORGANIC DEVICE HAVING AN INSULATING LAYER WITH AN UPPER SURFACE INCLUDING A SLOPE PORTION WITH AN ANGLE BETWEEN 50° AND 180° WITH RESPECT TO A SURFACE PARALLEL TO A MAIN SURFACE

(71) Applicant: CANON KABUSHIKI KAISHA, Tokyo (JP)

(72) Inventor: Tetsuo Takahashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 263 days.

(21) Appl. No.: 17/358,248

(22) Filed: Jun. 25, 2021

(65) Prior Publication Data

US 2022/0013604 A1   Jan. 13, 2022

(30) Foreign Application Priority Data

Jul. 9, 2020  (JP) .................. 2020-118736

(51) Int. Cl.
| | |
|---|---|
| H10K 59/122 | (2023.01) |
| H10K 39/32 | (2023.01) |
| H10K 50/852 | (2023.01) |
| H10K 59/30 | (2023.01) |
| H10K 50/818 | (2023.01) |
| H10K 59/38 | (2023.01) |
| H10K 102/00 | (2023.01) |

(52) U.S. Cl.
CPC .......... *H10K 59/122* (2023.02); *H10K 39/32* (2023.02); *H10K 50/852* (2023.02); *H10K 59/30* (2023.02); *H10K 50/818* (2023.02); *H10K 59/38* (2023.02); *H10K 2102/3026* (2023.02)

(58) Field of Classification Search
CPC ...... H10K 59/122; H10K 59/30; H10K 39/32; H10K 50/852; H10K 2102/3026; H10K 50/818
USPC .......................................... 257/40
See application file for complete search history.

(56) References Cited

U.S. PATENT DOCUMENTS

| | | |
|---|---|---|
| 9,142,598 B2 | 9/2015 | Ohnuma et al. |
| 9,502,676 B2 | 11/2016 | Ohnuma et al. |
| 9,716,208 B2 | 7/2017 | Dozen et al. |

(Continued)

FOREIGN PATENT DOCUMENTS

| | | |
|---|---|---|
| JP | 2013-12493 A | 1/2013 |
| JP | 2014-123527 A | 7/2014 |

(Continued)

*Primary Examiner* — Xia L Cross
(74) *Attorney, Agent, or Firm* — Venable LLP

(57) ABSTRACT

An organic device comprising first and second electrodes above a main surface of a substrate, an insulator which includes a first portion arranged between the first and second electrodes and a second portion arranged to cover a peripheral portion of the first electrode and an organic layer is provided. An upper surface of the insulator which is between a vertex portion of the second portion and at least one of a third portion of the first electrode which is not covered by the insulator and the first portion includes a slope portion having angle 50° to 180° with respect to the main surface. An upper end of the slope portion is farther from the main surface than an upper surface of a charge generating layer of the organic layer, and is closer to the main surface than an upper surface of the organic layer.

23 Claims, 13 Drawing Sheets

(56) References Cited

U.S. PATENT DOCUMENTS

| | | | |
|---|---|---|---|
| 9,917,274 B2 | 3/2018 | Ohnuma et al. | |
| 10,504,976 B2 | 12/2019 | Hanashima et al. | |
| 10,734,455 B2 | 8/2020 | Kajimoto et al. | |
| 2012/0248467 A1* | 10/2012 | Yokoyama | H10K 59/126 257/E51.018 |
| 2014/0175469 A1* | 6/2014 | Dozen | H10K 59/122 257/89 |

FOREIGN PATENT DOCUMENTS

| | | |
|---|---|---|
| JP | 2019-12684 A | 1/2019 |
| JP | 2019-91724 A | 6/2019 |
| JP | 2019-179716 A | 10/2019 |
| JP | 2019-220397 A | 12/2019 |

* cited by examiner

FIG. 9

| | HEIGHT OF UPPER SURFACE [nm] | LAYER THICKNESS RATIO |
|---|---|---|
| ORGANIC LAYER 4 | 181 | 0.9 |
| CHARGE TRANSPORT LAYER 431 | 141 | 0.3 |
| CHARGE GENERATING LAYER 42 | 121 | 0.3 |
| ORGANIC LAYER 41 | 108 | 0.3 |

FIG. 10

| | LAYER THICKNESS RATIO | | | $I_{leak}/I_{oled}$ | CURRENT (1.5 V IS APPLIED) |
|---|---|---|---|---|---|
| | CHARGE GENERATING LAYER 42 | CHARGE TRANSPORT LAYER 431 | ORGANIC LAYER 4 | | |
| EXAMPLE 1 | 0.3 | 0.3 | 0.7 | A | A |
| COMPARATIVE EXAMPLE 1 | 0.9 | 0.9 | 0.9 | B | A |
| COMPARATIVE EXAMPLE 2 | 0.3 | 0.3 | 0.3 | A | B |

ORGANIC DEVICE HAVING AN INSULATING LAYER WITH AN UPPER SURFACE INCLUDING A SLOPE PORTION WITH AN ANGLE BETWEEN 50° AND 180° WITH RESPECT TO A SURFACE PARALLEL TO A MAIN SURFACE

BACKGROUND OF THE INVENTION

Field of the Invention

The present invention relates to an organic device, a display device, a photoelectric conversion device, an electronic device, an illumination device, a mobile device lighting appliance, and a mobile device.

Description of the Related Art

An organic device that includes a photoelectric conversion element or a light emitting element which includes an organic layer for emitting light or performing photoelectric conversion has gained attention. Japanese Patent Laid-Open No. 2014-123527 discloses a light emitting device that includes, as the organic layer, a tandem element formed by stacking a plurality of light emitting units. Although the tandem element is advantageous in improving the light emission efficiency, crosstalk, which is a phenomenon in which a current leaks between adjacent elements via a highly conductive intermediate layer, tends to easily occur in the tandem element. In Japanese Patent Laid-Open No. 2014-123527, it is disclosed that crosstalk is suppressed by denting each partition wall positioned between lower electrodes.

SUMMARY OF THE INVENTION

Further suppression of a leak between elements is needed to improve the resolution and the efficiency of an organic device.

Some embodiments of the present invention provide a technique advantageous in suppressing a leak between elements in an organic device.

According to some embodiments, an organic device comprising a substrate, a first electrode and a second electrode arranged above a main surface of the substrate, an insulating layer which includes a first portion arranged between the first electrode and the second electrode and a second portion arranged to cover a peripheral portion of the first electrode, an organic layer arranged above the first electrode, the second electrode, and the insulating layer, and a third electrode arranged above the organic layer, wherein the organic layer includes a plurality of function layers and a charge generating layer arranged between the plurality of function layers, an upper surface, of the insulating layer, which is between a vertex portion, of the second portion, which is farthest from the main surface and at least one of a third portion, of the first electrode, which is not covered by the insulating layer and the first portion, includes a slope portion whose angle with respect to a surface parallel to the main surface is greater than 50° and less than 180°, and an upper end of the slope portion is farther from the main surface than an upper surface of the charge generating layer above the at least one of the first portion and the third portion, and is closer to the main surface than an upper surface of the organic layer above the at least one of the first portion and the third portion, is provided.

Further features of the present invention will become apparent from the following description of exemplary embodiments (with reference to the attached drawings).

BRIEF DESCRIPTION OF THE DRAWINGS

FIG. 9 is a table showing layer thickness ratios of the organic layer of the organic device of FIG. 1;

FIG. 10 is a table showing the evaluation results of Example 1 and Comparative Examples 1 and 2 of the organic device of FIG. 1;

DESCRIPTION OF THE EMBODIMENTS

Figure 1:
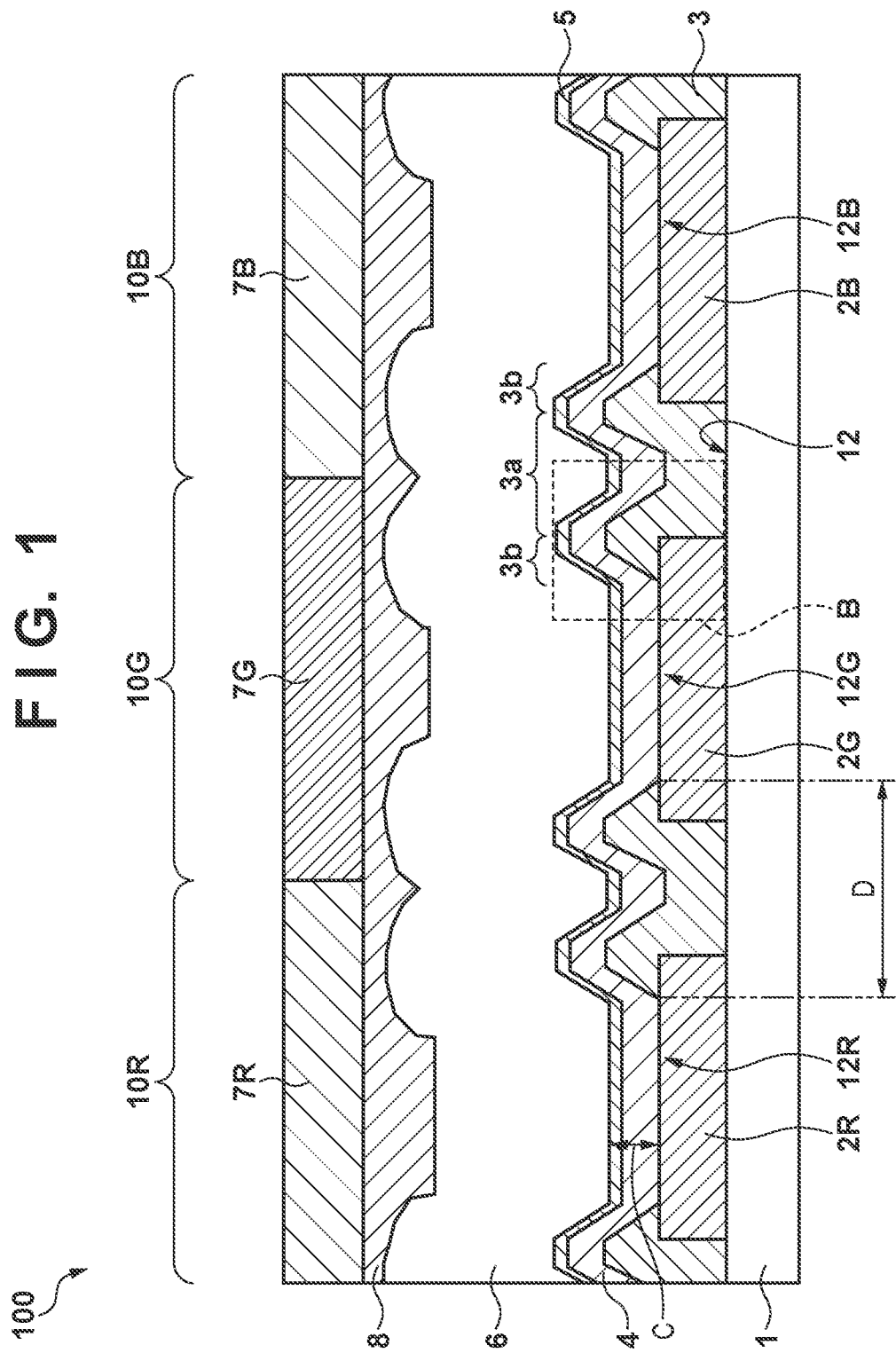
FIG. 1 is a sectional view showing an example of the arrangement of an organic device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
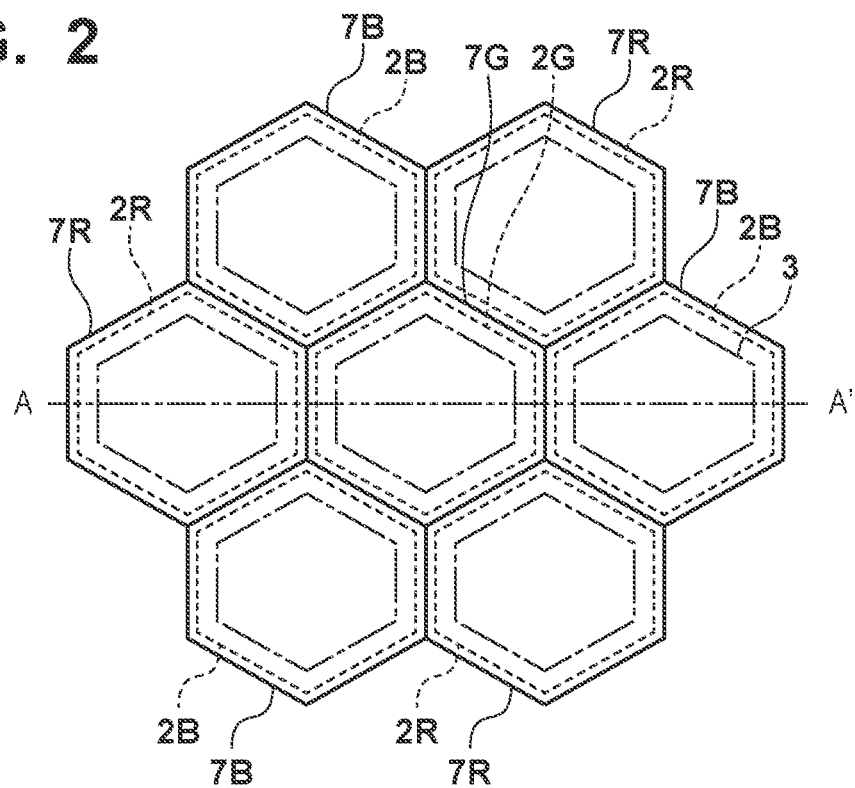
FIG. 2 is a plan view showing an example of the arrangement of the organic device of FIG. 1.

An organic device according to an embodiment of the present invention will be described with reference to FIGS. 1 to 17. FIG. 1 is a sectional view showing an example of the arrangement of an organic device 100 according to the embodiment. FIG. 2 is a bird's eye view of an upper surface of a portion of the organic device 100. A section taken along a line A-A' of FIG. 2 corresponds to FIG. 1 and shows an example in which a single pixel is formed by three light emitting elements 10. Although this embodiment shows an example of pixels in a delta array, the present invention is not limited to this. The pixels may be arranged in a striped array or a square array.

In this embodiment, the organic device 100 may be an organic light emitting device as to be described later. In such a case, an organic layer will include, for example, a light emitting layer. In addition, the organic device 100 according to this embodiment is not limited to an organic light emitting device. The organic device 100 may also be a photoelectric conversion device. In such a case, the organic layer will include, for example, a photoelectric conversion layer.

The organic device 100 includes a substrate 1 and the plurality of light emitting elements 10 arranged on the substrate 1. FIG. 1 shows three light emitting elements 10R, 10G, and 10B among the plurality of light emitting elements 10 included in the organic device 100. "R" of the light emitting element 10R indicates that the element emits red light. In a similar manner, "G" of the light emitting element 10G indicates that the element emits green light, and "B" of the light emitting element 10B indicates that the element emits blue light. In this specification, when indicating a specific light emitting element among the plurality of light emitting elements 10, a suffix such as "R" of the light emitting element 10R will be added following the reference numeral. In addition, when indicating any of the plurality of light emitting elements 10, it will be simply indicated as the light emitting element "10". This applies to other components in a similar manner.

The organic device 100 includes the substrate 1, a plurality of lower electrodes 2 arranged on a main surface 12 of the substrate 1, an insulating layer 3 which includes each portion 3a arranged between the lower electrodes 2 and each portion 3b arranged so as to cover a peripheral portion of the corresponding lower electrode 2, and an organic layer 4 arranged on the plurality of lower electrodes 2 and the insulating layer 3. In addition, in the organic device 100, an upper electrode 5 is arranged on the organic layer 4 so as to cover the organic layer 4. The lower electrodes 2 are separated by the insulating layer 3 in accordance with the respective light emitting elements 10.

A case in which the organic device 100 is a light emitting device will be described in detail here. In this embodiment, the organic device 100 is a top-emission device that extracts light from the upper electrode 5. Hence, the organic layer 4 includes a light emitting layer as a function layer. In addition, the organic device 100 can include a protective layer 6 arranged so as to cover the upper electrode 5 and a plurality of color filters 7 arranged in correspondence with the plurality of light emitting elements 10 on the protective layer 6. Furthermore, the organic device 100 may also include a planarization layer 8 between the protective layer 6 and the color filters 7. A case in which the organic device 100 is a light emitting device will be illustrated here. However, in a case in which the organic device 100 is a photoelectric conversion device, the organic layer 4 will include a photoelectric conversion layer as the function layer.

In this embodiment, the organic layer 4 emits white light, and color filters 7R, 7G, and 7B separate the white light emitted from the organic layer 4 into R, G, and B light beams, respectively. The color filters may also form a color conversion layer that absorbs light emitted from the organic layer 4 and coverts the absorbed light into another color.

In this embodiment, the terms "upper" and "lower" indicate the vertical direction in FIG. 1. Hence, a surface, of the lower electrode 2, on the side of the substrate 1 will be referred to as the "lower surface" of the lower electrode 2, and a surface, of the lower electrode 2, on the side of the organic layer 4 will be referred to as the "upper surface". Here, the lower surface of the lower electrode 2 indicates a surface in contact with an interlayer insulating layer of an uppermost surface of the substrate 1. For example, in a case in which a plug or the like for connecting to another wiring pattern is connected to the lower surface of the lower electrode 2, a substantially flat portion excluding this connection portion will be the lower surface of the lower electrode 2.

Although not illustrated in FIG. 1, the substrate 1 may include an interlayer insulating layer, a plug, a wiring line and a driving circuit including a transistor that are connected to the lower electrodes 2, and includes an interlayer insulating layer on its uppermost surface (the surface in contact with the lower electrodes 2). The interlayer insulating layer may be made of an inorganic compound, for example, silicon oxide, silicon nitride, silicon oxynitride, or the like. It may also be made of an organic compound such as polyimide, a polyacrylic compound, or the like. Since the organic layer 4 such as the function layer may degrade due to moisture, the interlayer insulating layer may be made of an inorganic material in the point of view preventing the entry of moisture. The interlayer insulating layer may also be referred to as a planarization layer for the purpose of reducing unevenness of the surface on which the lower electrodes 2 are formed.

A metal material which has a reflectance of 80% or higher with respect to the wavelength of emitted light from the organic layer 4 can be used for each lower electrode 2. For example, a metal such as Al, Ag, or the like or an alloy obtained by doping such a metal with Si, Cu, Ni, Nd, or the like can be used for each lower electrode 2. Here, the wavelength of emitted light indicates the range of the spectrum of light emitted from the organic layer 4. If the lower electrode 2 has a high reflectance with respect to the wavelength of emitted light from the organic layer 4, the lower electrode 2 may have a multilayer structure that includes a barrier layer. A metal such as Ti, W, Mo, Au, or the like or an alloy of such a metal may be used as the material of the barrier layer. The barrier layer may be a metal layer arranged on the upper surface of the lower electrode 2.

The insulating layer 3 can cover the peripheral portion of each lower electrode 2 and be arranged between the lower electrodes 2 and the organic layer 4. In addition, each lower electrode 2 can include a portion (a first region) covered by the insulating layer 3 and a portion (second region) not covered by the insulating layer 3 but covered by the organic layer 4. The second region may be said to be in contact with an organic layer 41 of the organic layer 4 in this embodiment (to be described later with reference to FIG. 3). Each second region overlaps a corresponding opening portion of the insulating layer 3 in an orthogonal projection with respect to the upper surface of the lower electrode 2. The lower electrode 2 becomes the light emitting region of each light emitting element 10.

That is, the top-view shape of the upper surface of the light emitting region of each light emitting element 10 may be a shape defined by a corresponding opening formed in the insulating layer 3. The insulating layer 3 suffices to have a function for electrically separating the lower electrodes 2 under the respective light emitting elements 10 and a function for defining the light emitting regions of the respective light emitting element 10, and is not limited to the shape shown in FIGS. 1 and 2.

The insulating layer 3 can be formed by, for example, a chemical vapor deposition method (CVD method), a physical vapor deposition method (PVD method), or the like. The insulating layer 3 may be made of, for example, silicon nitride (SiN), silicon oxynitride (SiON), silicon oxide, or the like. The insulating layer 3 may be a multilayer film made of silicon nitride, silicon oxynitride, silicon oxide, or the like.

The slope angle of the upper surface of each portion 3b or the like of the insulating layer 3 is controlled by a condition, for example, anisotropic etching, isotropic etching, or the like. The slope angle of the upper surface of each portion 3b or the like of the insulating layer 3 may also be controlled by controlling the slope angle of a layer immediately below the insulating layer 3. For example, the slope angle of the insulating layer 3 can be adjusted by forming, on the interlayer insulating layer of the uppermost surface of the substrate 1, a concave portion which includes a sloped side surface, and adjusting the angle of this slope. A concave-convex pattern may also be formed on the upper surface of the insulating layer 3 by executing processing such as etching, by increasing the number of stacked layers, or the like. The shape of the insulating layer 3 will be described later with reference to FIG. 3.

The organic layer 4 is arranged between the upper electrode 5 and the lower electrodes 2 and the insulating layer 3. The organic layer 4 is formed continuously on the substrate 1 and may be shared by the plurality of light emitting elements 10. That is, the plurality of light emitting elements 10 may share one organic layer 4. The organic layer 4 may be integrally formed on the entire surface of the display region for displaying an image on the organic device 100 as a light emitting device.

The organic layer 4 may include a hole transport layer, a light emitting layer, and an electron transport layer. Appropriate materials can be selected for the organic layer 4 from the viewpoints of light emission efficiency, driving life expectancy, and optical interference. The hole transport layer can function as an electron blocking layer or a hole injection layer, and can also have a multilayered structure including a hole injection layer, a hole transport layer, and an electron blocking layer. The light emitting layer as a function layer can have a multilayered structure including light emitting layers for emitting different colors, and can also be a mixed layer in which light emitting dopants for emitting different colors are mixed. The electron transport layer can function as a hole blocking layer or an electron injection layer, and can also have a multilayered structure including an electron injection layer, an electron transport layer, and a hole blocking layer.

In addition, the organic layer 4 can also include an intermediate layer that is arranged between a plurality of function layers (light emitting layers) and a plurality of function layers. The organic device 100 may also be a light emitting device that has a tandem structure in which the intermediate layer is a charge generating layer. In a tandem structure, a charge transport layer such as a hole transport layer, an electron transport layer, or the like may be formed between a charge generating layer and a light emitting layer.

The charge generating layer is a layer that contains an electron donating material and an electron accepting material and generates an electric charge. The electron donating material is a material that donates an electron, and the electron accepting material is a material that accepts an electron. Since a positive charge and a negative charge are generated in the charge generating layer, the positive charge or the negative charge can be supplied to layers above and below the charge generating layer. The electron donating material may be, for example, an alkali metal such as lithium or cesium. Further, the electron donating material may be, for example, lithium fluoride, a lithium complex, cesium carbonate, a cesium complex, or the like. In this case, the electron donating property may be exhibited by also containing a reducible material such as aluminum, magnesium, or calcium together with the electron donating material. The electron accepting material may be, for example, an inorganic compound such as molybdenum oxide, or an organic compound such as [Dipyrazino[2,3-f:2',3'-h]quinoxaline-2,3,6,7,10,11-hexacarbonitrile]. The electron receiving material and the electron donating material may be mixed or stacked.

The upper electrode 5 is arranged on the organic layer 4. The upper electrode 5 is continuously formed on the substrate 1 and can be shared by the plurality of light emitting elements 10. The upper electrode 5 can be integrally formed, in a manner similar to the organic layer 4, over the entire display region for displaying an image on the organic device 100 as the light emitting device. The upper electrode 5 is a light-transmissive electrode for transmitting the light emitted by the light emitting layer of the organic layer 4. The upper electrode 5 may also be an electrode that transmits at least some of the light beams which have reached the lower surface of the upper electrode 5. The upper electrode 5 may function as a semi-transmissive reflective layer that transmits some of the light beams but reflects the remaining light beams (that is, a layer that has semi-transmissive reflectivity).

The upper electrode 5 can be made of, for example, a metal such as magnesium or silver, an alloy containing magnesium or silver as a main component, or an alloy material containing an alkali metal or an alkaline earth metal. An oxide conductor or the like may also be used as the upper electrode 5. The upper electrode 5 may have a multilayer structure as long as it has an appropriate transmittivity.

The protective layer 6 can be made of, for example, a material that has a low permeability to oxygen and moisture from the outside, such as silicon nitride, silicon oxynitride, aluminum oxide, silicon oxide, titanium oxide, or the like. Silicon nitride and silicon oxynitride may be formed using, for example, a CVD method. On the other hand, aluminum oxide, silicon oxide, and titanium oxide can be formed using an atomic layer deposition method (ALD method).

The combination of constituent materials and manufacturing methods of the protective layer 6 is not limited to those exemplified above, and may be appropriately selected in consideration of the thickness of the layer to be formed, the time required for forming the layer, and the like. The protective layer 6 may have a single-layer structure or a multilayer structure as long as it transmits light transmitted through the upper electrode 5 and has a sufficient moisture blocking performance.

Each color filter 7 can be formed on the protective layer 6. Like the color filter 7R and the color filter 7G shown in FIG. 1, the color filters 7 may be in contact with each other without a gap. Furthermore, the color filters of different colors may be arranged so as to overlap each other.

In this embodiment, the planarization layer 8 is formed between the protective layer 6 and the color filter 7. The planarization layer 8 may be made of, for example, an organic compound such as polyimide, a polyacrylic compound, or the like. It may also have a multilayer structure formed by using inorganic compounds and organic compounds.

Figure 3:
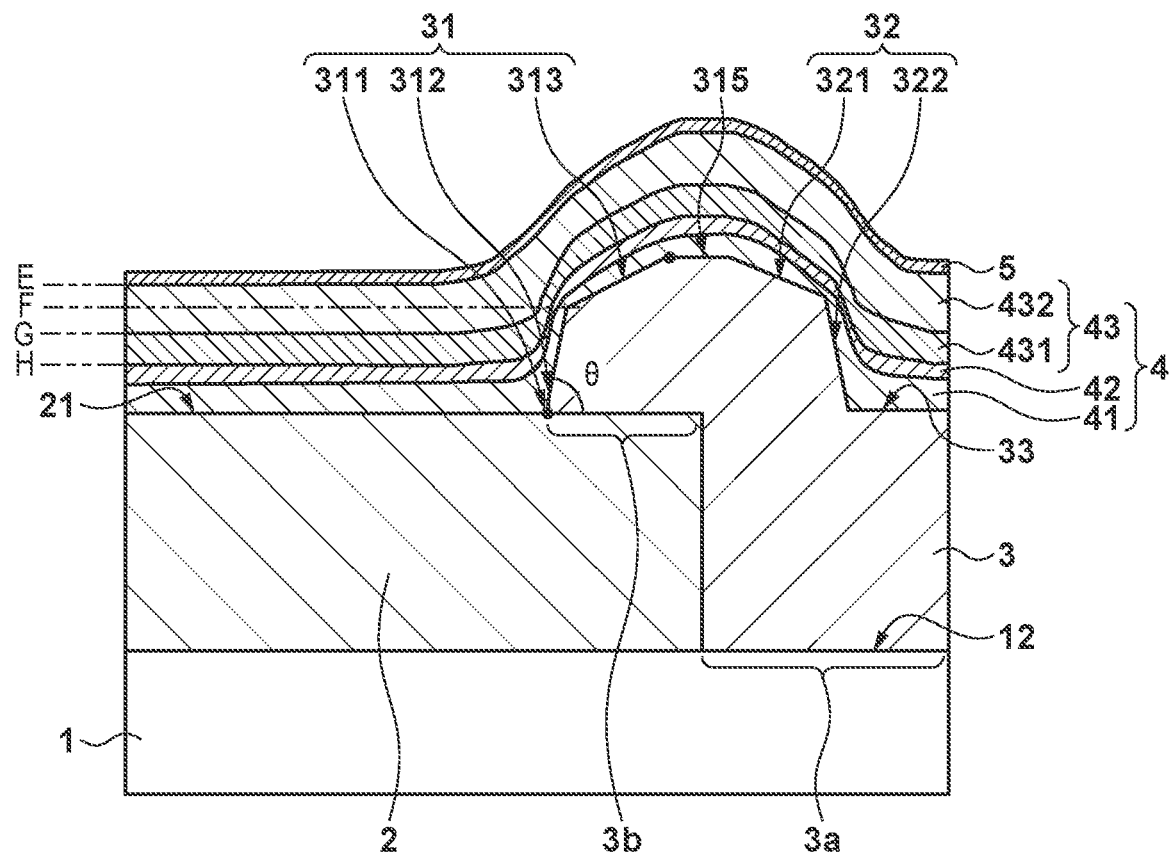
FIG. 3 is an enlarged view of a section showing an example of the arrangement of the organic device of FIG. 1.

The relationship between the insulating layer 3 and the organic layer 4 of the organic device according to this embodiment will be described next with reference to FIG. 3. FIG. 3 is an enlarged view of a region B indicated by dotted lines in FIG. 1. FIG. 3 shows the insulating layer 3 that is arranged between two lower electrodes 2 (a first electrode and a second electrode) which are arranged next to each other among the plurality of lower electrodes 2.

In the arrangement shown in FIG. 3, the upper surface of the lower electrode 2 includes a portion 21 which is not covered by the insulating layer 3, and the portion 3a of the insulating layer 3 includes a portion 33 which is arranged between two lower electrodes 2. Each of the portions 21 and 33 may be a portion whose angle with respect to a surface parallel to the main surface 12 is 0°. That is, the portions 21 and 33 can be portions substantially parallel to the main surface 12. The portion 33 of the insulating layer 3 can be a flat portion as shown in FIG. 3. In a case in which the interval between the two adjacent lower electrodes 2 is small, the portion 33 of the insulating layer 3 can also be a portion where the slope switches from a downward slope to an upward slope.

Here, a portion, of the portion 3b of the insulating layer 3, which is farthest from the main surface 12 will be referred to as a vertex portion 315. The vertex portion 315 may be flat, as shown in FIG. 3, or may be the portion where the slope switches from an upward slope to a downward slope.

An upper surface 31 of the insulating layer 3 between the vertex portion 315 and the portion 21 of the upper surface of the lower electrode 2 will be described next. The upper surface 31, of the insulating layer 3, which is between the vertex portion 315 and the portion 21 includes a slope portion 312 whose angle with respect to a surface parallel to the main surface 12 of the substrate 1 is greater than 50° and less than 180°. This slope portion 312 may also have an angle with respect to the surface parallel to the main surface 12 of the substrate 1 which is greater than 50° and 90° or less. The angle of the slope portion 312 may be constant as shown in FIG. 3 or may sequentially change or change in a stepwise manner. The slope portion 312 is a portion, of the upper surface 31, where the angle with respect to the surface parallel to the main surface 12 of the substrate 1 falls within the range of greater than 50° to less than 180°. That is, the slope portion 312 may have a reverse tapered shape with respect to the portion 21 of the upper surface of the lower electrode 2.

The organic layer 4 has a tandem structure as described above. That is, the organic layer 4 includes a plurality of function layers and a charge generating layer 42 which is arranged between the plurality of function layers. The organic layer 4 includes the organic layer 41 which includes a light emitting layer as a function layer arranged on a side closer to the substrate 1 than the charge generating layer 42 and an organic layer 43 which includes a light emitting layer as a function layer on a side farther from the substrate 1 than the charge generating layer 42.

In this embodiment, a distance from the main surface 12 of the substrate 1 to an upper surface H of the charge generating layer 42 and a distance from the main surface 12 to an upper end F of the slope portion 312 of the upper surface 31 of the insulating layer 3 satisfy the following relationship.

upper surface $H$ of charge generating layer 42<upper end $F$ of slope portion 312 of insulating layer 3 (1)

That is, the upper end F of the slope portion 312 of the upper surface 31 of the insulating layer 3 is farther from the main surface 12 of the substrate 1 than the upper surface H of the charge generating layer 42 on the portion 21 of the upper surface of the lower electrode 2.

As a result, it will be possible to decrease the film thickness of the charge generating layer 42 in the portion, of the charge generating layer 42, along the slope portion 312. Since the thinned portion of the charge generating layer 42 will have a high resistance, it will be possible to suppress the leakage current that can occur between the light emitting elements 10 (between the lower electrodes 2) due to the conduction of charges from the conductive charge generating layer 42.

In addition, in this embodiment, a distance from the main surface 12 of the substrate 1 to an upper surface E of the organic layer 4 and the distance from the main surface 12 of the substrate 1 to an upper end F of the slope portion 312 of the insulating layer 3 satisfy the following relationship.

upper surface $E$ of organic layer 4>upper end $F$ of slope portion 312 of insulating layer 3 (2)

That is, the upper end F of the slope portion 312 of the upper surface 31 of the insulating layer 3 is closer to the main surface 12 of the substrate 1 than the upper surface E of the organic layer 4 on the portion 21 of the upper surface of the lower electrode 2.

Hence, since the slope portion 312 will be embedded in the organic layer 4, the film thickness of the portion, of the organic layer 4, along the slope portion 312 will hardly decrease. As a result, it will be possible to suppress the leakage current between the upper electrode 5 and each lower electrode 2.

The organic layer 4 may include a plurality of charge generating layers including the charge generating layer 42. In such a case, the upper end F of the slope portion 312 of the upper surface 31 of the insulating layer 3 may be farther from the main surface 12 of the substrate 1 than the upper surface of any of the plurality of charge generating layers including the charge generating layer 42 on the portion 21 of the upper surface of the lower electrode 2. As a result, it will be possible to increase the effect of leak suppression between the adjacent light emitting elements 10 (between the lower electrodes 2).

As shown in FIG. 3, the organic layer 43 includes a charge transport layer 431 and an organic layer 432. The charge transport layer 431 is arranged between the charge generating layer 42 and the upper electrode 5. The organic layer 432 is in contact with the upper surface of the charge transport layer 431 and includes a light emitting layer. As a result, the charges generated in the charge generating layer 42 will efficiently flow to the light emitting layer arranged in the organic layer 432 via the charge transport layer 431, thus implementing a high light-emission efficiency.

At this time, in the arrangement shown in FIG. 3, a distance from the main surface of the substrate 1 to an upper surface G of the charge transport layer 431 which is in contact with the upper surface of the charge generating layer 42 and a distance from the main surface 12 of the substrate 1 to the upper end F of the slope portion 312 of the insulating layer 3 may satisfy the following relationship.

upper surface $G$ of charge transport layer 431<upper end $F$ of slope portion 312 of the insulating layer 3 (3)

That is, the upper end F of the slope portion 312 of the upper surface 31 of the insulating layer 3 may be farther from main surface 12 of the substrate 1 than the upper surface G of the charge transport layer 431 on the portion 21 of the upper surface of the lower electrode 2.

Since this will allow the film thickness of the portion, of the charge transport layer 431, along the slope portion 312 to be decreased, it will be possible also suppress the leakage current that occurs between the light emitting elements 10 (the lower electrodes 2) when charges generated from the charge generating layer 42 flow in the charge transport layer 431. Since the charge transport layer 431 has, in general, high charge transportability in the direction between the light emitting elements 10 (between the lower electrodes 2), the effect of leak suppression between the light emitting elements 10 (between the lower electrodes 2) will increase by arranging the upper end F of the slope portion 312 in a position higher than the upper surface G of the charge transport layer 431.

The charge transport layer 431 may be a hole transport layer. Since the leakage current between the light emitting elements 10 (the lower electrodes 2) will flow more easily if the hole transport layer has higher mobility than an electron transport layer, the effect of the embodiment can be further increased.

In addition, the upper surface 31, of the insulating layer 3, between the vertex portion 315 of the insulating layer 3 and the portion 21 of the lower electrode 2 can further include a gentle slope portion 313 whose angle with respect to the surface parallel to the main surface 12 of the substrate 1 is 0° or more and 50° or less. As shown in FIG. 3, the gentle slope portion 313 may be arranged between the vertex portion 315 and the slope portion 312. This will prevent the formation of a portion where the film thickness of the organic layer 4 decreases along the upper surface 31 of the insulating layer 3. As a result, it will be possible to suppress the leakage current from being generated between the upper electrode 5 and the lower electrode 2. The slope portion 312 and the gentle slope portion 313 can be formed by performing, for example, isotropic etching and anisotropic etching in combination after depositing a material film which is to be formed into the insulating layer 3.

The position of the upper end F of the slope portion 312 of the upper surface 31 between the vertex portion 315 of the insulating layer 3 and the portion 21 of the lower electrode 2 has been described above. However, the present invention is not limited to this, and a similar relationship may exist for an upper surface 32 between the vertex portion 315 of the insulating layer 3 and the portion 33 of the insulating layer 3. That is, each of the upper surfaces 31 and 32, of the insulating layer 3, that is between the vertex portion 315, of the insulating layer 3, which is farthest from the main surface 12 and at least the corresponding one of the portion 33 and the portion 21 which is not covered by the insulating layer 3 of the lower electrode 2 may include a corresponding one of the slope portion 312 and a slope portion 322, whose the angle with respect to the surface of parallel to the main surface 12 of is greater than 50° and less than 180°. Alternatively, the angle with respect to the surface parallel to the main surface 12 of each of the slope portions 312 and 322 may be greater than 50° and 90° or less.

More specifically, the upper surface 32, of the insulating layer 3, which is between the vertex portion 315 and the portion 33 of the insulating layer 3 includes the slope portion 322 whose angle with respect to the surface parallel to the main surface 12 of the substrate 1 is greater than greater than 50° and less than 180°. At this time, the upper end of the slope portion 322 of the upper surface 32 of the insulating layer 3 may be farther from the main surface 12 of the substrate 1 than the upper surface of the charge generating layer 42 of the organic layer 4 on the portion 33 of the insulating layer 3. The upper end of the slope portion 322 of the upper surface 32 of the insulating layer 3 may also be closer to the main surface 12 of the substrate 1 than the upper surface of the organic layer 4 on the portion 33 of the insulating layer 3. That is, the relationships of inequalities (1) and (2) described above may be satisfied. Furthermore, the upper end of the slope portion 322 of the upper surface 32 of the insulating layer 3 may be farther from the main surface 12 of the substrate 1 than the upper surface of the charge transport layer 431 on the portion 33 of the insulating layer 3. That is, the relationship of inequality (3) described above may be satisfied.

In addition, the upper surface 32 of the insulating layer 3 may further include a gentle slope portion 321 whose angle with respect to the surface parallel to the main surface 12 of the substrate 1 is 0° or more and 50° or less. The angle of the gentle slope portion 321 may be constant or may sequentially change or change in a stepwise manner. The slope portion 312 is a portion, of the upper surface 31, where the angle with respect to the surface parallel to the main surface 12 of the substrate 1 falls within the range of 0° or more to 50° or less. In this case, as shown in FIG. 3, the gentle slope portion 321 may be arranged between the vertex portion 315 and the slope portion 322. Also, the portion, of the gentle slope portion 321, which is farthest from the main surface 12 of the substrate can be referred to as the vertex portion 315.

In addition, although the portion 21 of the upper portion of the lower electrode 2 and the portion 33 of the insulating layer 3 are drawn at approximately the same height in FIG. 3, the present invention is not limited to this. For example, the portion 21 may be arranged at a position farther from the main surface 12 of the substrate 1 than the portion 33.

Figure 4:
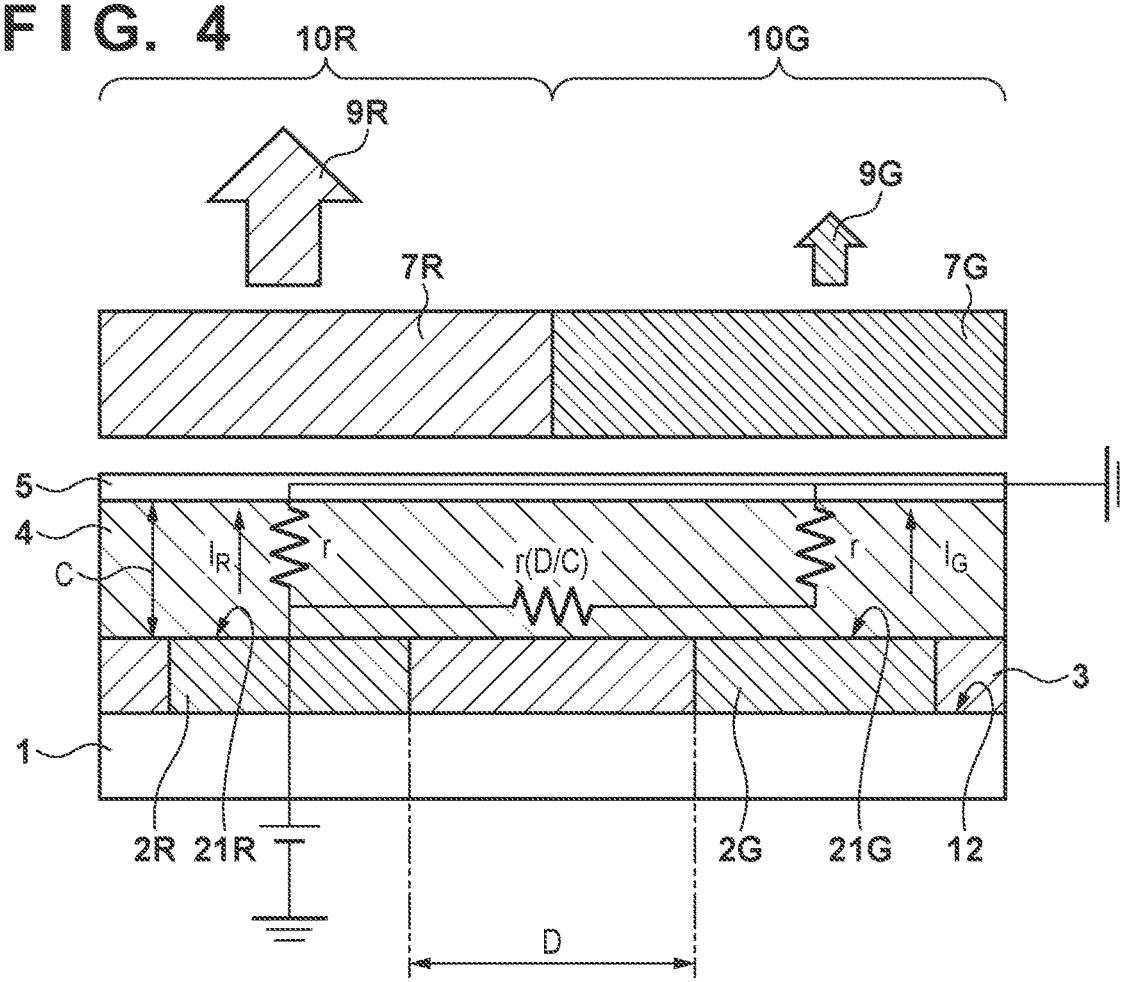
FIG. 4 is a view for explaining a leakage current between elements of the organic device of FIG. 1.

A more effective arrangement of the embodiment will be described next with reference to FIGS. 4 and 5. FIG. 4 is a schematic view of an organic device according to a comparative example in which the light emitting element 10R including the red color filter 7R and the light emitting element 10G including the green color filter 7G have been formed. The difference from the organic device 100 according to this embodiment shown in FIGS. 1 to 3 is that the insulating layer 3 does not cover the peripheral portion of each lower electrode 2 and is arranged only between the lower electrodes 2.

In FIG. 4, an equivalent circuit related to the leakage current of the light emitting element 10R has been overlaid and illustrated. The equivalent circuit of FIG. 4 indicates the resistance of the organic layer 4 and is not embedded with an electronic circuit. An equivalent circuit of the light emitting element 10G has also been overlaid and illustrated to describe the leakage current between the lower electrodes 2.

Let C be a thickness of the organic layer 4 on portions 21R and 21G of lower electrodes 2R and 2G, respectively, and D be a distance between a portion, of the lower electrode 2R, which is not covered by the insulating layer 3 and a portion, of the lower electrode 2G, which is not covered by the insulating layer 3. In addition, let r be a resistance per unit area, of the organic layer 4, in the vertical direction (thickness direction) with respect to the main surface 12 of the substrate 1.

The above-described effect of suppressing the leakage current generated by causing a current to flow in (lighting) the lower electrode 2R can be obtained when the ratio (to be also referred to as a D/C ratio hereinafter) of the distance D to the thickness C of the organic layer 4 is less than 50

(D/C<50). The lower the D/C ratio of the distance D to the thickness C of the organic layer 4 is, the shorter the distance, with respect to the thickness C of the organic layer 4, between the light emitting regions where the organic layer 4 and the lower electrodes 2 of the respective light emitting element 10 come into contact is. That is, as the value of the D/C ratio decreases, the organic device will have a higher resolution array in which the light emitting elements 10 are increasingly finely arrayed, and the leakage current between the lower electrodes 2 will become more problematic. The evidence of this will be described below.

In the organic device according to the comparative example of FIG. 4, r(D/C) is a resistance per unit area of the organic layer 4 in a direction parallel to the lower surface of the lower electrode 2. Here, letting $I_R$ be a current that flows in the light emitting element 10R and $I_G$ be a leakage current generated in the light emitting element 10G due to the current $I_R$ flowing in the light emitting element 10R, the following relation is established.

$$I_G/I_R = 1/(1+D/C) \tag{4}$$

According to equation (4), the current $I_R$ that flows in the light emitting element 10R and the leakage current $I_G$ generated in the light emitting element 10G have a proportional relationship in which the thickness C of the organic layer 4 and the distance D are coefficients. That is, even if light is to be emitted from only the red light emitting element 10R (an arrow 9R), a current will also flow to the green light emitting element 10G (an arrow 9G) and light will be emitted from the green light element. Furthermore, the leakage current $I_G$ in this case is dependent on the D/C ratio.

In a case in which $S_R$ is an emitted light spectrum of only the red light emitting element 10R and $S_G$ is an emitted light spectrum of only the green light emitting element 10G when both light emitting elements emit light at identical current amounts, an emitted light spectrum $S_{R+G}$ that takes the leakage current between the lower electrodes 2 into consideration will be as follows.

$$S_{R+G} = S_R + S_G(I_G/I_R) \tag{5}$$

Figure 5:
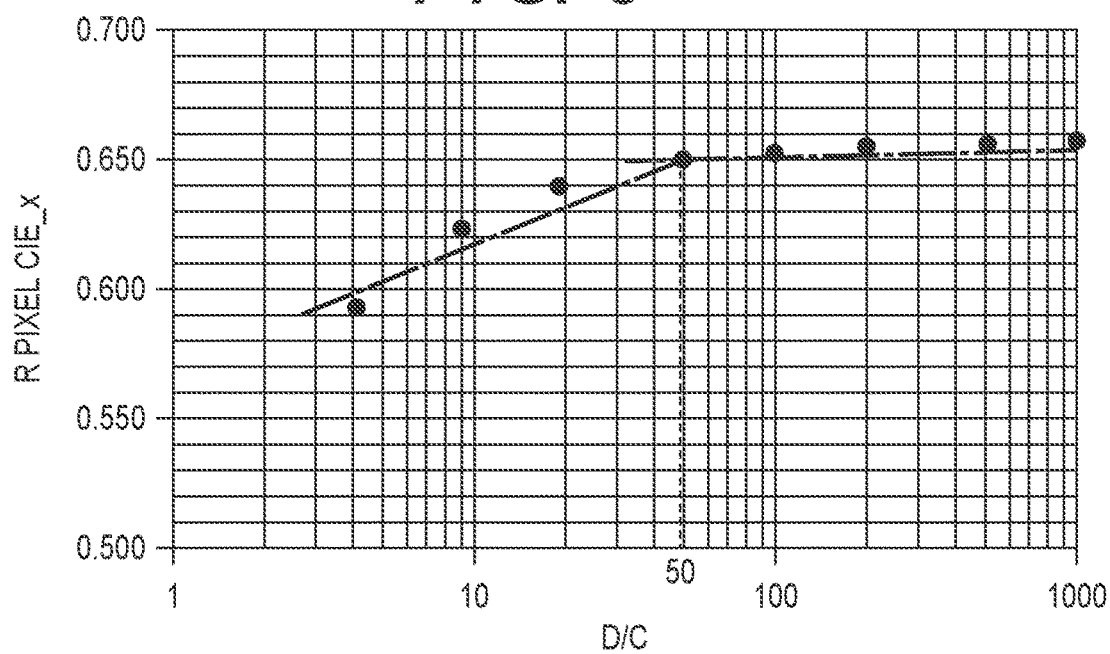
FIG. 5 is a graph showing a relationship between chromaticity of a red pixel and the structure of the organic device of FIG. 1.

FIG. 5 shows a graph obtained by calculating the chromaticity coordinates in a CIExy space of the emitted light spectrum $S_{R+G}$ and setting the ordinate and the abscissa to represent κ-coordinate values and D/C ratios, respectively. In FIG. 5, the x-coordinate value changing represents the green light is also being emitted even though only the red light is intended to be emitted. That is, in FIG. 5, a small x-coordinate value represents the occurrence of a leakage current to the light emitting element 10G which is arranged adjacent to the light emitting element 10R. As shown in FIG. 5, the x-coordinate value hardly changes when the D/C ratio is 50 or more. That is, even in a case in which the insulating layer 3 does not cover the peripheral portion of each lower electrode 2 and the leakage current can be easily generated between the lower electrodes 2, the generation of the leakage current between the lower electrode 2 may not become a problem if the D/C ratio is 50 or more.

On the other hand, the x-coordinate value greatly decreases and the degradation of the color purity of the red light become conspicuous when the D/C ratio is less than 50, and it is obvious that the leakage current generated between the lower electrodes 2 is influencing the color purity. That is, since the density of the arrangement of the light emitting elements 10 will be high when the D/C ratio is less than 50, the influence of the leakage current between the lower electrodes 2 on the organic device 100 becomes conspicuous. Hence, in a case in which the D/C ratio is less than 50, the effect of suppressing the leakage current between the lower electrodes 2 can become particularly high in a structure that includes the slope portions 312 and 322 of the upper surfaces 31 and 32 of the insulating layer 3 as shown in FIG. 3.

A structure that considers the light interference in the light emitting element 10 will be described next. An optical path length between the upper electrode 5 and each lower electrode 2 of the organic device 100 according to this embodiment may have a strengthening interference structure. A strengthening interference structure can also be referred to as a resonance structure.

By forming a plurality of layers to be included in the organic layer 4 to satisfy an optical interference condition for strengthening light in each light emitting element 10, it will be possible to use optical interference to strengthen the light extracted from the organic device 100. Setting an optical condition that strengths the extracted light in a front surface direction will allow the light to be emitted more efficiently in the front surface direction (the upward direction in FIGS. 1 and 3). In addition, the full width at half maximum of an emitted light spectrum of light strengthened by optical interference is known to become smaller than an emitted light spectrum before the interference. That is, the color purity can be increased.

When the plurality of layers are designed with respect to light of a wavelength λ, a strengthening interference can be set by adjusting a distance $d_0$ from a light emission position of an emitted light layer to a reflection surface of a reflective material (the lower electrode 2) to $d_0 = i\lambda/4n_0$ (i=1, 3, 5, ...) As a result, components in the front surface direction will increase in the distribution of the emitted light of the wavelength λ, thus improving the luminance of the front surface. Note that $n_0$ is a refractive index of the wavelength λ from the light emission position to the layer of the reflection surface.

Letting φr[rad] be a sum of phase shift amounts when light of the wavelength λ is reflected by the reflection surface, an optical path length Lr between the light emission position to the reflection surface of the lower electrode 2 is as follows.

$$Lr = (2m - (\varphi r/\pi)) \times (\lambda/4) \tag{6}$$

Note that an optical path length L is the total sum of the product of a refractive index nj of each layer and a thickness dj of each layer of the organic layer 4. That is, L can be expressed as $\Sigma nj \times dj$ as well as $n_0 \times d_0$. Note that φ is a negative value. In equation (6), m is an integer of 0 or more. Note that when φ=−π, L=λ/4 if m=0 and L=3λ/4 if m=1. The condition of m=0 in equation (6) will be referred to as a λ/4 interference condition, and the condition of m=1 in equation (6) will be referred to as a 3λ/4 interference condition, hereinafter.

Letting φs[rad] be a sum of phase shift amounts when light of the wavelength λ is reflected by the reflection surface, an optical path length Ls between the light emission position to the reflection surface of the light extraction electrode (upper electrode 5) is as follows.

$$Ls = (2m' - (\varphi s/\pi)) \times (\lambda/4) = -(\varphi s/\pi) \times (\lambda/4) \tag{7}$$

where m' is an integer of 0 or more.

Hence, a whole layer interference L is as follows.

$$L = (Lr + Ls) = (2m - (\varphi/\pi)) \times (\lambda/4) \tag{8}$$

where φ is a sum (φr+φs) of phase shifts when the light of the wavelength λ is reflected by the reflective electrode and the light extraction electrode.

In this case, taking the characteristics of the angle of view and the like which have a trade-off relationship with the light extraction efficiency of the front surface into consideration, the structure of the actual light emitting element 10 need not strictly match that according to the above-described equation. More specifically, L may have an error that falls within a range of a value which is ±λ/8 from a value that satisfies equation (8). A tolerance at which the value of L can be apart from the interference condition can be 50 nm or more to 75 nm or less.

Hence, an organic light emitting device according to this embodiment may satisfy $$(\lambda/8) \times (4m - (2\varphi/\pi) - 1) < L < (\lambda/8) \times (4m - (2\varphi/\pi) + 1) \quad (9)$$

Furthermore, L may fall within a range of a value which is ±λ/16 from a value that satisfies equation (8), and may satisfy $$(\lambda/16) \times (8m - (4\varphi/\pi) - 1) < L < (\lambda/16) \times (8m - (4\varphi/\pi) + 1) \quad (9')$$

The light emitting element 10 may be set so that m=10 and m'=0 in inequality (9) and inequality (9'), respectively, that is, may be set in accordance with the λ/4 interference condition. In this case, inequality (9) and inequality (9') will be expressed as $$(\lambda/8) \times (-(2\varphi/\pi) - 1) < L < (\lambda/8) \times (-(2\varphi/\pi) + 1) \quad (10)$$

$$(\lambda/16) \times (-(4\varphi/\pi) - 1) < L < (\lambda/16) \times (-(4\varphi/\pi) + 1) \quad (10'),$$

respectively.

If m=0 and m'=0 in inequality (9) and inequality (9'), the organic layer 4 will have the smallest film thickness in the strengthening interference structure. This will reduce the driving voltage of the light emitting element 10, and the light emitting element 10 will be able to emit light at a higher luminance within the range of the upper limit of the power supply voltage. If the organic layer 4 becomes thin, a leakage current will be generated more easily between the upper electrode 5 and each lower electrode 2. Therefore, the organic layer 4 cannot be thinned simply by using the slope of the insulating layer 3. In contrast, by satisfying inequality (1) and inequality (2) described above, it will be possible to suppress the generation of the leakage current between the lower electrodes 2 while suppressing the leakage current between the upper electrode 5 and each lower electrode 2. Furthermore, by satisfying inequality (3) described above, the generation of the leakage current between the lower electrodes 2 can be further suppressed.

The wavelength λ of the emitted light may here be the maximum peak wavelength of an emitted light spectrum of light emitted by the light emitting layer of the organic layer 4. In general, in the light emission of an organic compound, the peak on the short wavelength side of the emitted light spectrum is the maximum emitted light. Hence, the maximum peak wavelength can be, for example, the wavelength of the peak on the shortest wavelength side of the emitted light spectrum.

In addition, the thickness of the organic layer 4 in a direction perpendicular to the upper surface (for example, the portion 21) of the lower electrode 2 in the portion in contact with the lower electrode 2 may be less than 100 nm. This will allow the driving voltage of the organic device 100 to be reduced more easily. This will also increase the effect of the embodiment in which the generation of the leakage current between the lower electrodes 2 is suppressed while also suppressing the generation of the leakage current between the upper electrode 5 and each lower electrode 2.

Figure 6:
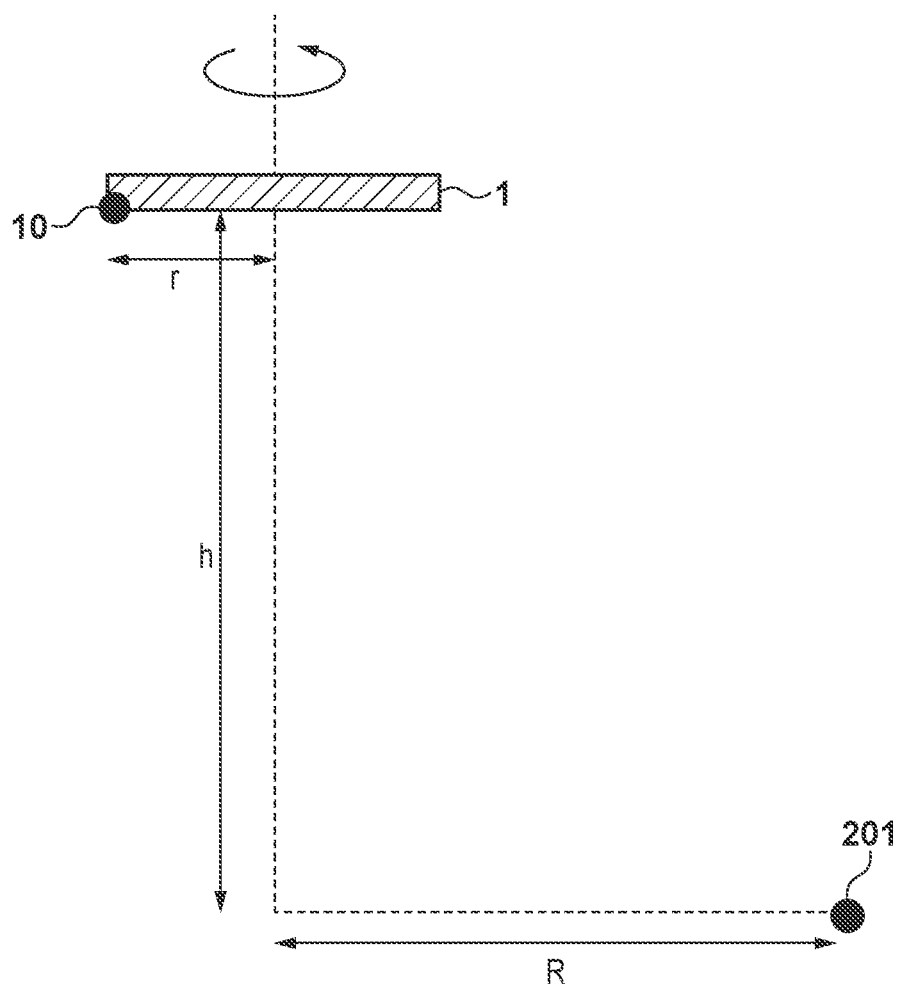
FIG. 6 is a view showing the arrangement of each member when deposition of an organic layer of the organic device of FIG. 1 is simulated.

In this embodiment, the slope angle (the angle with respect to the surface parallel to the main surface 12 of the substrate 1) of the slope portion 312 falls within a range in which the angle is greater than 50° and is less than 180°. If the slope angle is greater than 50°, the thickness of the region of the organic layer 4 along the slope portion 312 will easily decrease. On the other hand, if the slope angle is 50° or less, the thickness of the organic layer 4 along the slope portion 312 will hardly decrease. To substantiate the relationship between the organic layer 4 and the slope angle, a simulation of deposition by a vapor deposition method was performed. FIG. 6 is a view of the arrangement of each member during the simulation of the deposition. A deposition source 201, the substrate 1, and the light emitting element 10 arranged on the substrate 1 were set at respective positions as shown in FIG. 6 so that R=200 mm, r=95 mm, and h=340 mm. In addition, the simulation was set so that n=2 in a deposition distribution expressed as follows.

$$\varphi = \varphi_0 \cos^n \alpha \quad (11)$$

where α is an angle, φ is a vapor flow density at the angle α, and $\varphi_0$ is a vapor flow density at α=0. In addition, it was assumed that the substrate 1 will be rotated at the center of the substrate.

Figure 7:
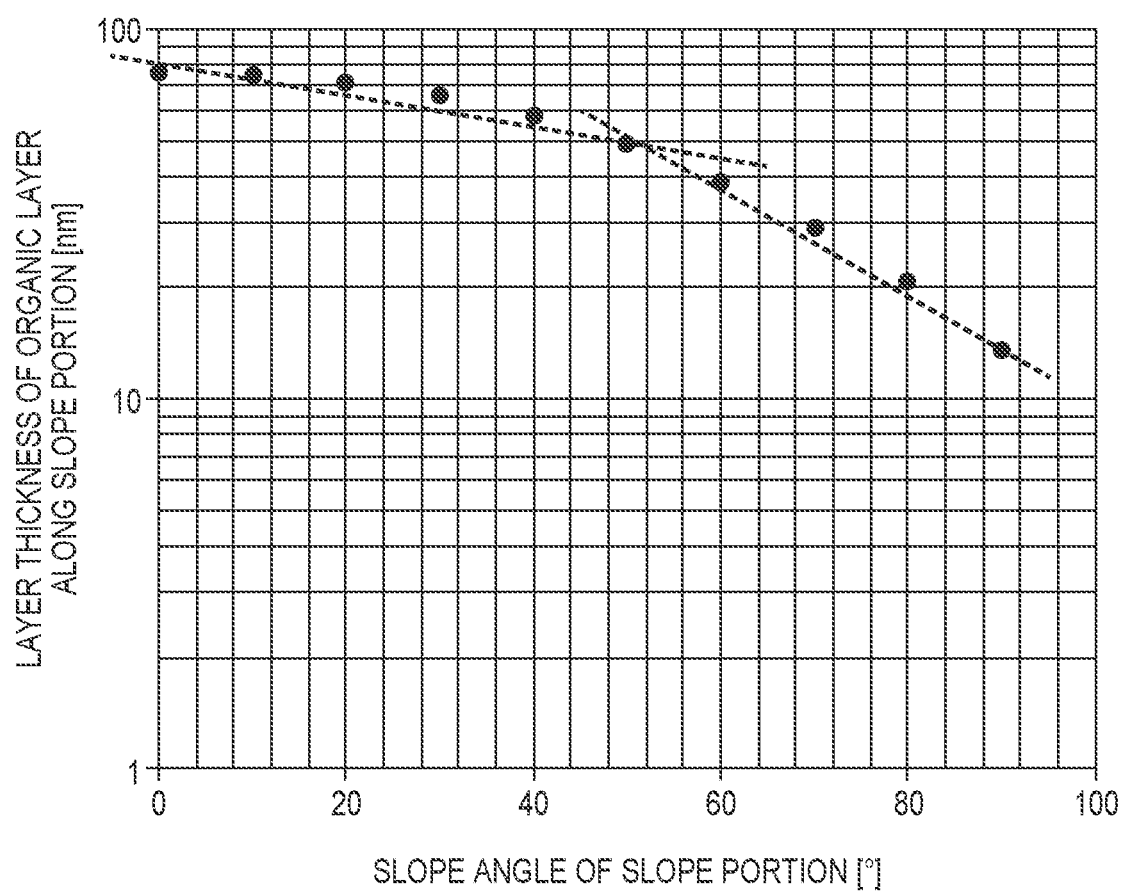
FIG. 7 is a graph showing the result of the simulation of FIG. 6.

A case in which a slope portion having slope angles between 0° to 90° is present in the position of the light emitting element 10 on the substrate 1 was hypothesized, and the layer thickness of the organic layer 4 along the slope portion at each slope angle when the layer thickness of the organic layer 4 at the slope angle 0° is 76 nm was calculated. FIG. 7 shows the result of the simulation of the deposition. It can be seen that the inflection point of the graph is 50°.

Hence, by setting the angle, of each of the slope portions 312 and 322, with respect to the surface parallel to the main surface 12 of the substrate 1 to be greater than 50°, it will be possible to reduce the thickness of the charge generating layer 42 and the thickness of the charge transport layer 431. As a result, the generation of a leakage current between adjacent lower electrodes 2 can be effectively suppressed. In addition, by adjusting the slope angle of the slope portion 312 to fall within a range of greater than 50° and less than 90°, the film thicknesses of the portions of the organic layer 4, the charge generating layer 42, and the charge transport layer 431 that contribute to leakage current reduction can be adjusted to appropriate thicknesses. Furthermore, by setting the slope angle of the slope portion 312 in a reverse tapered shape that is greater than 90°, the thickness of the charge generating layer 42 and the thickness of the charge transport layer 431 can be reduced. Hence, the slope angle of the slope portion 312 may be adjusted to fall within a range of greater than 50° and less than 120°. Furthermore, the slope angle of the slope portion 312 may be adjusted to fall within a range of greater than 50° and less than 150°. In addition, the slope angle of the slope portion 312 may be adjusted to fall within a range of greater than 50° and less than 180°.

In addition, by setting the slope angle (the angle with respect to the surface parallel to the main surface 12 of the substrate 1) of the gentle slope portion 313 to be 0° or more and 50° or less, it will be possible to suppress the film thickness of the organic layer 4 from becoming too thin. Therefore, it will be possible to reduce the leakage current between the lower electrodes 2 while suppressing the leakage current between the upper electrode 5 and each lower electrode 2.

Figure 8:
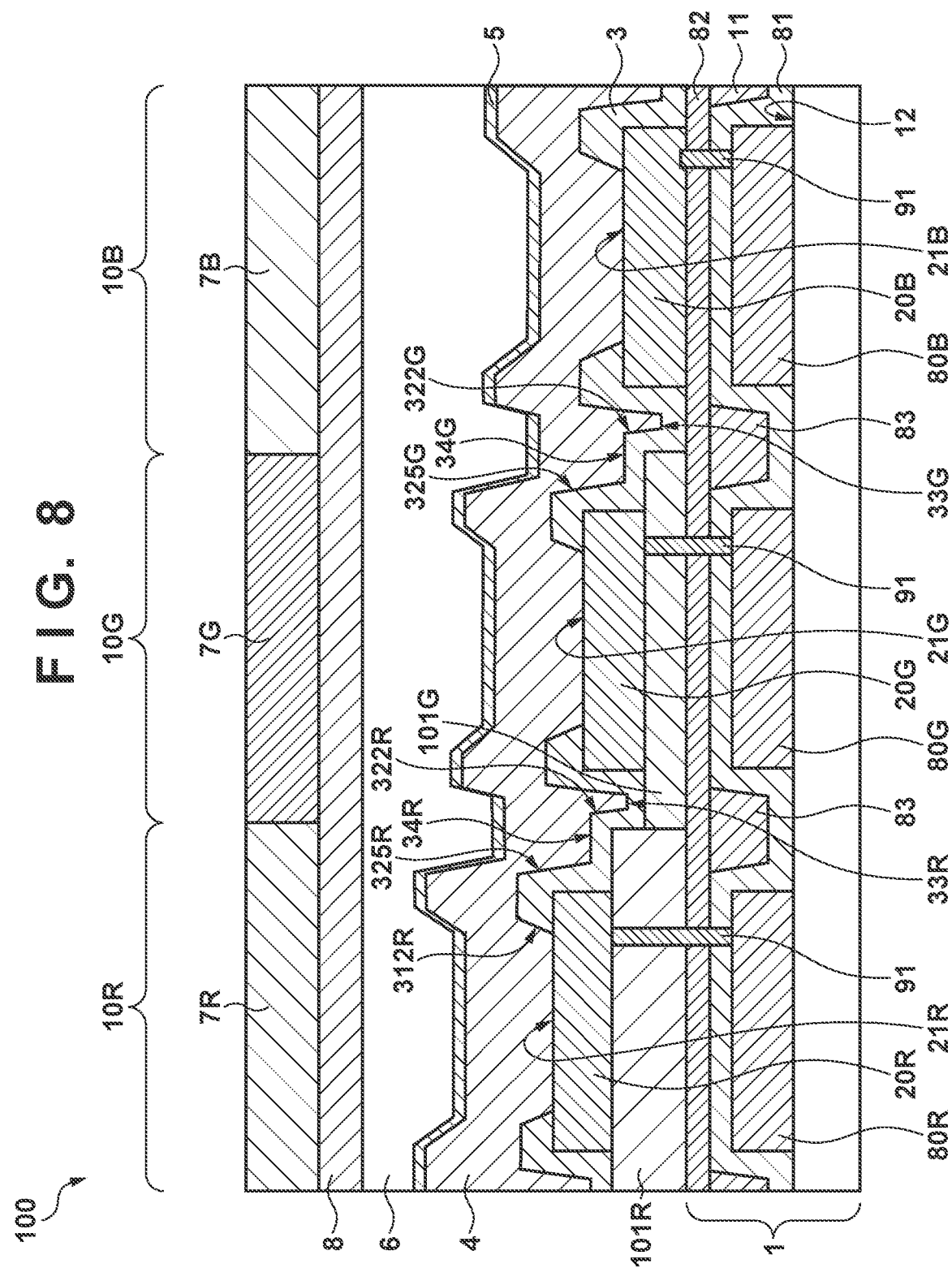
FIG. 8 is a view showing a modification of the organic device of FIG. 1.

FIG. 8 is a sectional view showing a modification of the organic device 100 shown in FIGS. 1 and 3. Lower electrodes 20 (20R, 20G, and 20B) and reflective electrodes 80

(80R, 80G, and 80B) are connected to each other via corresponding plugs 91. The above-described insulating layer 3 is arranged between the lower electrodes 20 of the light emitting elements 10 which are adjacent to each other. A lower insulating layer 81 is arranged between the reflective electrodes 80. The lower insulating layer 81 includes concave portion between each adjacent reflective electrodes 80, and an inter-side-wall insulating layer 83 is arranged between the side walls of the concave portion. The upper surface of the inter-side-wall insulating layer 83 is covered by an intermediate insulating layer 82.

The reflective electrodes 80 are arranged on the substrate 1, and the lower insulating layer 81 and the intermediate insulating layer 82 are arranged between the reflective electrodes 80 and the lower electrodes 20. In addition, in a sub-pixel where the light emitting element 10R is to be arranged, an optical adjustment layer 101R is arranged between the intermediate insulating layer 82 and the lower electrode 20R. In a sub-pixel where the light emitting element 10G is to be arranged, an optical adjustment layer 101G is arranged between the intermediate insulating layer 82 and the lower electrode 20G. In a sub-pixel where the light emitting element 10B is to be arranged, an optical adjustment layer is not arranged between the intermediate insulating layer 82 and the lower electrode 20B. Although an arrangement in which the reflective electrodes 80 are arranged is shown in FIG. 8, a light reflecting layer which is to be arranged between each optical adjustment layer 101 and the substrate 1 need not have the function of an electrode.

In the arrangement shown in FIG. 8, the optical adjustment layer 101R and the optical adjustment layer 101G are illustrated as separate insulating layers. However, the present invention is not limited to this. For example, a common insulating layer may be arranged between the intermediate insulating layer 82 and the lower electrodes 20R and 20G, and another insulating layer may be arranged between the common insulating layer and the lower electrode 20R.

Each optical adjustment layer 101 is, for example, an insulating layer, and may be an inorganic compound or an organic compound. For example, in the point of view of suppressing the entry of moisture to the organic layer 4, the optical adjustment layer 101 may be made of an inorganic compound. More specifically, for example, the optical adjustment layer 101 can be formed by using silicon oxide, silicon nitride, silicon oxynitride, or a combination of these compounds.

In the light emitting elements 10R and 10G, the lower electrodes 20R and 20G are formed on the respective optical adjustment layers 101, and the insulating layer 3 is formed so as to cover the peripheral portion of each of the lower electrodes 20. The insulating layer 3 may also cover the end portion of the optical adjustment layer 101R and the end portion of the optical adjustment layer 101G.

Each reflective electrode 80 is a light reflective electrode and can be formed by using a material similar to the above-described lower electrode 2. The lower insulating layer 81, the intermediate insulating layer 82, and each optical adjustment layer 101 are light-transmissive insulating members, and can be formed by using a material similar to the insulating layer 3. The lower electrodes 20 are light-transmissive conductive members, and can be formed by using a conductive oxide or the like such as ITO (indium tin oxide), IZO (indium zinc oxide), or the like.

The organic device 100 according to this embodiment can optimize the distance related to optical interference of each of the red light emitting element 10R, the green light emitting element 10G, and the blue light emitting element 10B. Since other arrangements can be similar to the arrangements of the organic device 100 shown in FIG. 1, individual descriptions thereof will be omitted.

The side closer to the lower electrode 20R of the insulating layer 3 of the light emitting element 10R will be described. In a manner similar to the relationship between the lower electrode 2 and the insulating layer 3, a portion 21R which is not covered by the insulating layer 3 can be present in the upper surface of the lower electrodes 20, and a portion 312R can be present in the upper surface 31 of the insulating layer 3. A this time, the relationship of the distance from the main surface 12 of the substrate 1 to the portion 312R and the distance from the main surface 12 of the substrate 1 to each layer of the organic layer 4 may satisfy inequality (1) and inequality (2) described above.

In addition, the side of the portion 3a, which is on a side opposite to the lower electrode, of the insulating layer 3 of the light emitting element 10R will be described. In a manner similar to the relationship between the upper surface 32 and the portion 33 on the side of the portion 3a of the insulating layer 3 described above, a portion 34R and a slope portion 325R of the insulating layer 3 can also be present. At this time, the relationship of the distance from the main surface 12 of the substrate 1 to the slope portion 325R and the distance from the main surface 12 of the substrate 1 to each layer of the organic layer 4 may satisfy inequality (1) and inequality (2) described above. At this time, as shown in FIG. 8, the portion 21R of the upper surface of the lower electrodes 20 may be arranged in a position farther from the main surface 12 of the substrate 1 than the portion 34R of the upper surface of the insulating layer 3.

Furthermore, the insulating layer 3 arranged between the light emitting element 10R and the light emitting element 10G will be described. The insulating layer 3 arranged between the light emitting element 10R and the light emitting element 10G can include, between the lower electrode 20G and the portion 34R which is arranged on the optical adjustment layer 101R, a portion 33R which is closer to the main surface 12 of the substrate 1 than the portion 34R. The portion 33R can be a flat portion substantially parallel to the main surface 12 of the substrate 1. In addition, the portion 33R can be a portion where the slope changed from a downward slope into an upward slope between the portion 34R and the lower electrode 20G. A slope portion 322R which is arranged, between the portion 34R and the portion 33R, on the upper surface of the insulating layer 3 may also be set so that the relationship between the distance from the main surface 12 of the substrate 1 to the slope portion 322R and the distance from the main surface 12 of the substrate 1 to each layer of the organic layer 4 will satisfy inequality (1) and inequality (2) described above. In addition, upper surface of the insulating layer 3 which is arranged between the portion 33R and the lower electrode 20G may also satisfy inequality (1) and inequality (2) described above. Furthermore, the insulating layer 3 arranged between the lower electrode 20G and the lower electrode 20B may also satisfy inequality (1) and inequality (2) described above.

As a result, both the suppression of the leakage current between the light emitting elements 10 and the suppression of the leakage current between the upper electrode 5 and each lower electrode 20 can be implemented more easily. By arranging two "steep slope portions (corresponding to the above-described slope portions 312 and 322)", each having an angle with respect to the surface parallel to the main surface 12 of the substrate 1 that is greater than 50° and less than 180°, between the light emitting elements 10, there will be two locations where the resistance will be high due to the small film thickness of the charge generating layer 42. As a result, the leakage current between the light emitting elements 10 can be suppressed more easily. In addition, since using two steep slope portions will allow the height of each steep slope portion to be set lower than the height (the distance from the main surface 12) of the upper end of the organic layer 4 more easily, it will be possible to suppress the leakage current between the upper electrode 5 and each lower electrode 20 more easily than a case in which the leakage current between the light emitting elements 10 is to be suppressed by increasing the height of one steep slope portion.

In the arrangement shown in FIGS. 1 and 3, a layer in which a change in the layer thickness is associated with optical interference is limited to the organic layer 4 between the lower electrodes 2 and the upper electrode 5. On the other hand, in the arrangement shown in FIG. 8, a layer in which a change in the layer thickness is associated with optical interference also includes, in addition to the organic layer 4, layers from the layer immediately above the reflective electrodes 80 which have light reflectivity to up to the light-transmissive lower electrodes 20. Hence, the organic layer 4 needs to be set thin. As a result, the organic layer 4 will become thinner in the steep slope portions of the insulating layer 3, and a leakage current will flow more easily between the upper electrode 5 and each lower electrode 2. Therefore, the organic device 100 of FIG. 8 can greatly benefit from the effect of leakage current suppression.

In addition, as shown in FIG. 8, the organic device 100 that optimizes an optical interference path by adjusting, for the light emitting element 10 of each color, the thicknesses of respective layers lower (closer to the side of the substrate 1) than the organic layer 4 tends to include a large step, between the light emitting elements 10, in a layer immediately below the organic layer 4. Hence, the organic device 100 according to this embodiment can greatly benefit from the above-described effect obtained by including steep slope portions.

In the arrangement shown in FIG. 8, the steep slope portions may be arranged between light emitting elements 10 with the largest difference in the distance between the upper surface of the lower electrode 2 and the main surface 12 of the substrate 1. For example, in FIG. 8, the light emitting element 10R can be arranged on a side opposite to the light emitting element 10B and the light emitting element 10G. The relationship between the upper surface of the insulating layer 3 between the light emitting element 10B and the light emitting element 10R and each layer of the organic layer 4 may satisfy the relationships of the inequalities (1) and (2) described above. Since the organic layer 4 tends to become thin between the light emitting elements 10 with the largest difference in the distance between the upper surface of the lower electrode 2 and the main surface 12 of the substrate 1, it can greatly benefit from the effect of the leakage current suppression described above.

In this embodiment, a light emitting layer that contains a material that has the shortest wavelength light emission peak among the light emitting materials may be arranged closer to the side of the substrate 1 than other light emitting layers. Since this will reduce the distance from the light emitting layer that contains a material that has the shortest wavelength light emission peak to each reflective electrode 80 in terms of an optical design relationship, the organic layer 4 can be decreased. This will lower the driving voltage of each light emitting element 10, and light emission can be performed at a higher luminance within the range of the upper limit of the power supply voltage. The leakage current between the upper electrode 5 and each lower electrode 20 will be generated more easily if the organic layer 4 is decreased. Hence, the organic layer 4 cannot be thinned by simply using the slope of the insulating layer 3. However, by satisfying the conditions of inequalities (1), (2), and (3) described above, it will be possible to sufficiently suppress the leakage current between the lower electrode 2 while suppressing the leakage current between the upper electrode 5 and each lower electrode 2.

An example (Example 1) of the organic device 100 according to this embodiment will be described next.

First, the lower electrodes 2 was formed by forming a metal layer on the substrate 1 and etching desired regions of the metal layer by using a mask pattern and the like. Next, the insulating layer 3 was formed to cover the peripheral portion of each lower electrode 2. In this example, the insulating layer 3 was formed by oxide silicon, and the film thickness, in a direction perpendicular to the upper surface of the lower electrode 2, of the insulating layer 3 on the upper surface of the lower electrode 2 was set to 170 nm.

After forming the insulating layer 3, opening portions were formed by etching to expose the portions 21 of the upper surfaces of the respective lower electrodes 2. The shape of the insulating layer 3 was, as shown in FIG. 3, a shape that included the slope portions 312 and 322 and the gentle slope portions 313 and 321. The angle (slope angle), of the slope portion 312, with respect to the surface parallel to the main surface 12 of the substrate 1 was 80°, and that of the gentle slope portion 313 was 10°. The difference between the distance from the main surface 12 of the substrate 1 to the upper end of the slope portion 312 and the distance from the main surface 12 of the substrate 1 to the portion 21 not covered by the insulating layer 3 of the lower electrode 2 was 150 nm. That is, the upper end of the slope portion 312 is arranged at a position higher than the portion 21 of the lower electrode 2 by 150 nm. In addition, the slope angle of the slope portion 322 was 80°, and the slope angle of a gentle slope portion 321 was 10°. The difference between the distance from the main surface 12 of the substrate 1 to the upper end of the slope portion 322 and the distance from the main surface 12 of the substrate 1 to the portion 33 of the insulating layer 3 was 150 nm. That is, the upper end of the slope portion 322 is arranged at a position higher than the portion 33 of the insulating layer 3 by 150 nm.

In this example, pixels were arranged in a delta array in which each pixel has a hexagonal shape as shown in FIG. 2. The distance between portions (opening portions) not covered by the insulating layer 3 among two adjacent lower electrodes 2 was set to 1.4 µm, and the distance between the adjacent lower electrodes 2 was set to 0.6 µm.

The organic layer 4 was formed next. The organic layer 4 was formed to include a hole transport layer (a layer formed by stacking a hole injection layer, a hole transport layer, and an electron blocking layer), a light emitting layer having a two-layer arrangement, and an electron transport layer (a layer formed by stacking an electron transport layer and an electron injection layer) in this order. First, a material indicated as compound 1 below was deposited, on the substrate 1, to form the hole injection layer with a thickness of 7 nm.

compound 1

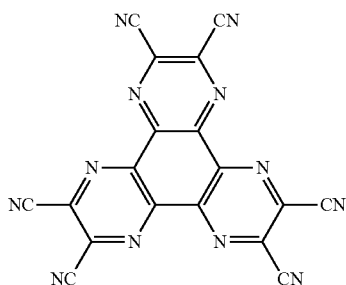

Next, a material as indicated as compound 2 below was deposited to form the hole transport layer with a thickness of 5 nm, and a material indicated as compound 3 below was deposited to form the electron blocking layer with a thickness of 45 nm. Subsequently, as the first layer of the light emitting layer, a light emitting layer in which a material indicated below as compound 6 was used as a host material and a material indicated below as compound 4 was used as a light emitting dopant was formed. The light emitting dopant was adjusted to have a weight ratio of 1%, and the layer thickness of the first layer of the light-emitting layer was set to 30 nm. Next, compound 7 indicated below was deposited to form the electron transport layer with a thickness of 21 nm.

compound 2

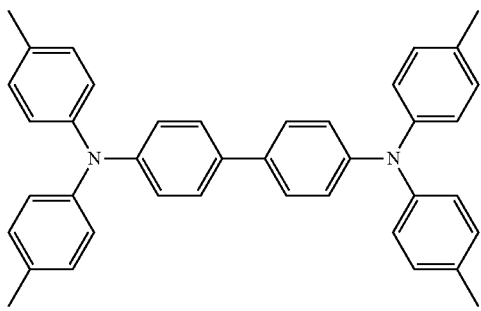

compound 3

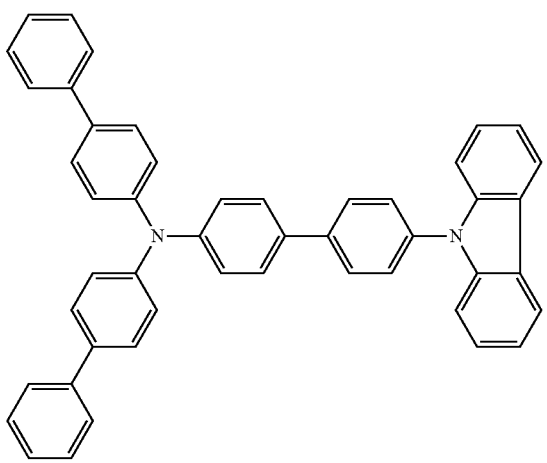

compound 4

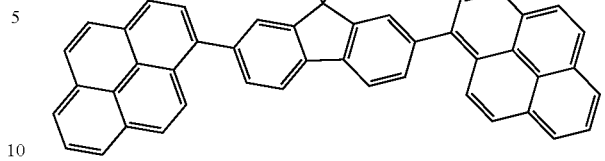

compound 5

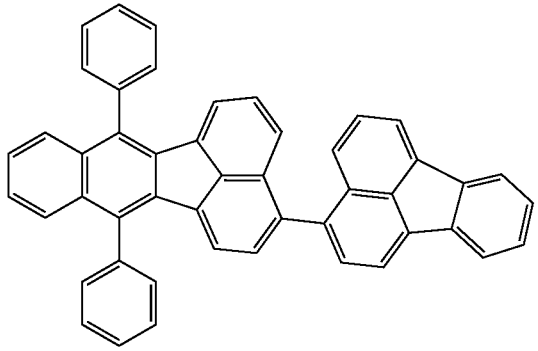

Next, LiF was deposited to form a first charge-generating layer with a thickness of 1 nm, Al was deposited to form a second charge-generating layer with a thickness of 2 nm, and molybdenum oxide ($MoO_3$) was deposited to form a third charge-generating layer with a thickness of 10 nm.

Next, the material indicated above as compound 2 was deposited to form the hole transport layer with a thickness of 5 nm, and compound 3 described above was deposited to form the electron blocking layer with a thickness of 15 nm.

Next, as the second layer of the light emitting layer, a light emitting layer in which compound 4 described above was the host material and compound 5 described above was the light emitting dopant was formed. The light emitting dopant was adjusted to have a weight ratio of 3%, and the layer thickness of the second layer of the light emitting layer was set to 10 nm. After the formation of the light emitting layer with the two-layer structure, compound 7 described below was deposited to form an electron transport layer with a thickness of 30 nm, and LiF was deposited to form an electron injection layer with a thickness of 0.5 nm.

compound 6

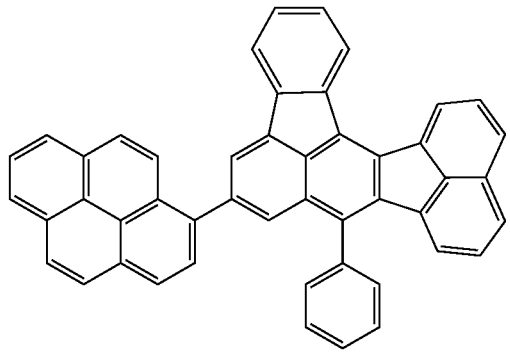

compound 7

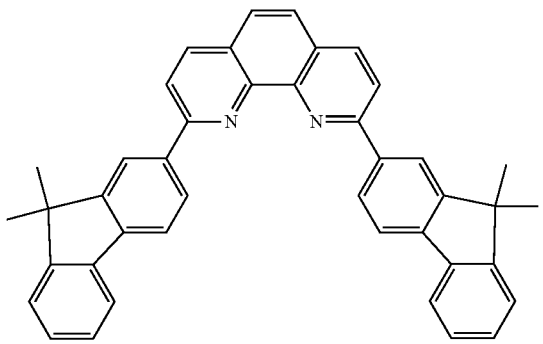

After the formation of the organic layer 4, a MgAg alloy in which the ratio of Mg and Ag was 1:1 was deposited as the upper electrode 5 with a thickness of 10 nm. After the formation of the upper electrode 5, silicon nitride was deposited by using CVD to form the protective layer 6 with a thickness of 1.5 μm. After the formation of the protective layer 6, the planarization layer 8 and the color filter 7 were formed.

The ratio of a distance of 1.4 μm between portions not covered by the insulating layer 3 of two adjacent lower electrodes 2 to a thickness of 181 nm (total of the organic layers) of a portion, of the organic layer 4, which was in contact with the portion 21 of each lower electrode was 8 or more and less than 50.

The height of the charge generating layer 42, which was above the portion 21, from the portion 21 was 121 nm. Also, the height of the upper surface of the charge transport layer 431, which was above the portion 21 and was in contact with the upper surface of the charge generating layer 42, from the portion 21 was 141 nm. In addition, the thickness of the organic layer 4 on the portion 33, the height from the portion 33 to the upper surface of the charge generating layer 42, and the height from the portion 33 to the upper surface of the charge transport layer 431 were similar to the values measured above from the portion 21. Furthermore, as described above, the upper end of the slope portion 312 and the upper end of the slope portion 322 were arranged in positions higher than the portion 21 and the portion 33, respectively, by 150 nm.

Hence, the upper end of the slope portion 312 and the upper end of the slope portion 322 were farther from the main surface 12 of the substrate 1 than the upper surface of the charge generating layer 42 above the portion 21 and the portion 33, respectively. That is, the relationship of inequality (1) described above has been satisfied. In addition, the upper end of the slope portion 312 and the upper end of the slope portion 322 were closer to the main surface 12 of the substrate 1 than the upper surface of the organic layer 4 on the portion 21 and the portion 33, respectively. That is, the relationship of inequality (2) described above has been satisfied. Furthermore, the upper end of the slope portion 312 and the upper end of the slope portion 322 were farther from the main surface 12 of the substrate 1 than the upper surface of the charge transport layer 431 on the portion 21 and the portion 33, respectively. That is, the relationship of inequality (3) described above has been satisfied.

The characteristics of the organic device 100 according to this example will be described next. A method of measuring $I_{leak}/I_{oled}$ as an index related to the leakage current between the lower electrodes 2 will be described first by using the light emitting element 10R as an example.

The light emitting element 10R was energized in a state in which the light emitting element 10G and the light emitting element 10B as the two adjacent pixels were short-circuited (potential=0 V). At this time, $I_{OLED}$ denotes a current that flowed from the lower electrode 2R of the light emitting element 10R to the upper electrode 5 of the light emitting element 10R, and $I_{leak}$ denotes a current that flowed from the lower electrode 2R of the light emitting element 10R to the upper electrode 5 of the light emitting element 10G or the upper electrode 5 of the light emitting element 10B. $I_{leak}$ was measured by using a potential value in which $I_{oled}$ was 0.1 nA/pixel. Assume that the ratio of $I_{leak}$ to $I_{oled}$ was $I_{leak}/I_{oled}$.

The leakage current between the upper electrode 5 and the lower electrode 2 will be described next. A light emission threshold voltage of each light emitting element 10 is approximately 2 V. Hence, in the light emitting element 10 in which the leakage current between the upper electrode 5 and the lower electrode 2 does not occur, a current will not flow even if, for example, a voltage of 1.5 V is applied between the upper electrode 5 and the lower electrode 2. However, in the light emitting element 10 in which the leakage current between the upper electrode 5 and the lower electrode 2 does occur, a current will flow if a voltage of 1.5 V is applied between the upper electrode 5 and the lower electrode 2. Therefore, the current value when a voltage of 1.5 V was applied between the upper electrode 5 and the lower electrode 2R of the light emitting element 10R was measured. That is, the current that flows when a voltage of 1.5 V is applied is a leakage current.

In addition, the film thickness of each layer of the organic device 100 according to this example was measured from a cross-sectional TEM image. The measurement locations were the entire organic layer 4 formed along the portion 21, the organic layer 41, the charge generating layer 42, and the charge transport layer 431. In addition, the layer thickness of the thinnest portion of each layer formed between the portion 21 and the portion 33 was measured for each of the entire organic layer 4, the organic layer 41, the charge generating layer 42, and the charge transport layer 431. Furthermore, for each of the organic layer 4, the organic layer 41, the charge generating layer 42, and the charge transport layer 431, the ratio of the layer thickness of the thinnest portion to the layer thickness of the portion 21 or 33 was calculated as a layer thickness ratio. The results are shown in FIG. 9.

From FIG. 9, it can be seen that, in the portions 21 and 33, the layer thickness ratio of a layer that has an upper surface at a height lower than 150 nm, which is the height of the upper end of the slope portion 312 and the upper end of the slope portion 322, tends to become low. In addition, it can be seen that, in the portions 21 and 33, the layer thickness ratio of a layer that has an upper surface at a height higher than 150 nm, which is the height of the upper end of the slope portion 312 and the upper end of the slope portion 322, does not tend to become low. That is, it is possible to suppress the leakage current between the lower electrodes 2 while suppressing the leakage current between the upper electrode 5 and each lower electrode 2.

Organic devices manufactured as comparative examples will be described next. An organic device according to Comparative Example 1 was manufactured in a manner similar to Example 1 other than in the point that the upper end of the slope portion 312 was arranged in a position higher than the portion 21 by 70 nm and the upper end of the slope portion 322 was arranged in a position higher than the portion 33 by 70 nm. In addition, an organic device according to Comparative Example 2 was manufactured in a manner similar to Example 1 other than in the point that the upper end of the slope portion 312 was arranged in a position higher than the lower electrode 21 by 200 nm and the upper end of the slope portion 322 was arranged in a position higher than the portion 33 by 200 nm.

The evaluation results of the organic devices according to Example 1, Comparative Example 1, and Comparative Example 2 are summarized in FIG. 10. In FIG. 10, in a case in which $I_{leak}/I_{oled}$ was equal to or less than 0.40, it was evaluated that the leakage current was suppressed, and "A" was given as the evaluation result. In a case in which $I_{leak}/I_{oled}$ was greater than 0.40, it was evaluated that the leakage current suppression was insufficient, and "B" was given as the evaluation result. In the evaluation of the current generated when a voltage of 1.5 V was applied between the upper electrode 5 and the lower electrode 2, in a case in which the current was equal to or less than $10^{-5}$ nA/pixel, it was evaluated that the leakage current was suppressed and "A" was given as the evaluation result, and in a case in which the current was greater than $10^{-5}$ nA/pixel, it was evaluated that the leakage current suppression was insufficient, and "B" was given as the evaluation result.

According to FIG. 10, in the organic device of Example 1, the upper ends of the slope portion 312 and the slope portion 322 are farther from the main surface 12 of the substrate 1 than the upper surface of the charge generating layer 42 on the portion 21 and the portion 33, respectively, and are closer to the main surface 12 of the substrate 1 than upper surface of the organic layer 4 on the portion 21 and the portion 33, respectively. Hence, it can be seen that the leakage current between the light emitting elements 10 (the lower electrodes 2) and the leakage current between the upper electrode 5 and each lower electrode 2 are both suppressed, and favorable characteristics are obtained.

On the other hand, in the organic device of Comparative Example 1, the upper ends of the slope portion 312 and the slope portion 322 are closer to the main surface 12 of the substrate 1 than the upper surface of the charge generating layer 42 on the portion 21 and the portion 33, respectively. Hence, it can be seen that the leakage current between the light emitting elements 10 (lower electrodes 2) cannot be suppressed insufficiently. In addition, in the organic device of Comparative Example 2, the upper ends of the slope portion 312 and the slope portion 322 are farther from the main surface 12 of the substrate 1 than upper surface of the organic layer 4 on the portion 21 and the portion 33, respectively. Hence, it can be seen that the leakage current between the upper electrode 5 and each lower electrode 2 cannot be suppressed insufficiently.

The light emitting element 10 will be described here. Each of the light emitting elements 10 is arranged by forming, on the substrate 1, an anode, an organic compound layer, and a cathode. The protective layer 6 and the color filter 7 can be formed on the cathode. If the color filter 7 is to be arranged, the planarization layer 8 may be arranged between the protective layer 6 and the color filter 7. The planarization layer 8 can be made of an acrylic resin or the like.

The above embodiment described that a semiconductor substrate such as a silicon will be used as the substrate 1. However, the present invention is not limited to this. Quartz, glass, a silicon wafer, a resin, a metal, or the like can be used as the substrate 1. In addition, as described in the above embodiment, a switching element such as a transistor or the like and wiring lines can be arranged on the substrate 1, and an insulating later can be arranged further atop these elements. The material of the insulating layer is not particularly limited as long as it is a material that can form a contact hole for ensuring conductance between the anode of the light emitting element 10 and the transistor formed in the substrate and can ensure insulation from a wiring pattern which is not to be connected. For example, a resin such as polyamide or the like, silicon oxide, silicon nitride, or the like may be used.

A pair of electrodes (the upper electrode 5 and each lower electrode 2 described above) can be used as the electrodes. The pair of electrodes may have an anode and a cathode. If an electric field is to be applied in a direction in which each light emitting element 10 is to emit light, the electrode with the higher potential will be the anode and the other electrode will be the cathode. It can be also said that the electrode that supplies holes to the light emitting layer of the light emitting element 10 is the anode and the electrode that supplies electrons is the cathode.

As the constituent material of the anode, a material having a large work function can be used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used as the anode. Furthermore, a conductive polymer such as polyaniline, polypyrrole, or polythiophene can also be used as the anode.

One of these electrode materials may be used singly, or two or more of them may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. When the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function can be used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used as the cathode. A metal oxide such as indium tin oxide (ITO) can also be used. One of these electrode materials may be used singly, or two or more of them may be used in combination. The cathode may have a single-layer structure or a multilayer structure. For the cathode, silver may be used, or a silver alloy may be used to suppress aggregation of silver. The ratio of the alloy is not limited as long as aggregation of silver can be suppressed. For example, the ratio between silver and a material other than silver may be 1:1.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but if direct current sputtering or alternating current sputtering is used, the good film coverage is provided and the resistance is easily lowered.

The protective layer 6 may be provided on the cathode. For example, by adhering glass provided with a moisture absorbing agent on the cathode, permeation of water or the like into the light emitting layer such as an organic EL layer can be suppressed and occurrence of display defects can be suppressed. Furthermore, as another embodiment, a passivation film made of silicon nitride or the like may be provided on the cathode to suppress permeation of water or the like into the light emitting layer. For example, after forming the cathode and transferring it to another chamber without breaking the vacuum, a silicon nitride film having a thickness of 2 μm may be formed by a chemical vapor deposition method (CVD method), thereby obtaining the protective layer 6. The protective layer 6 may be provided using an atomic deposition method (ALD method) after forming a film using the CVD method.

The color filter 7 may be provided on the protective layer 6. For example, the color filter 7 with consideration to the size of the light emitting element 10 may be provided on another substrate, and the substrate with the color filter 7 provided thereon may be bonded to the substrate 1 with the light emitting element 10 provided thereon. Alternatively, the color filter 7 may be patterned on the above-described protective layer 6 by using a photolithography technique. The color filter 7 may be formed from a polymeric material.

The planarization layer 8 may be provided between the color filter 7 and the protective layer 6. The planarization layer 8 may be formed from an organic compound, and may be made of a low-molecular material or a polymeric material. For example, the planarization layer 8 can be formed from a polymeric organic compound.

The planarization layer 8 may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

A counter substrate may be provided on the planarization layer 8. The counter substrate is called a counter substrate because it is provided at a position corresponding to the above-described substrate. The constituent material of the counter substrate may be the same as that of the above-described substrate 1.

The organic layer 4 (a hole injection layer, a hole transport layer, an electron blocking layer, a light emitting layer, a hole blocking layer, an electron transport layer, an electron injection layer, and the like) forming the light emitting element 10 according to an embodiment of the present invention is formed by the method to be described below. The organic layer 4 can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the organic layer 4 is formed by a vacuum deposition method, a solution coating method, or the like, crystallization or the like hardly occurs and excellent temporal stability is obtained. Furthermore, when the organic layer 4 is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

Figure 11:
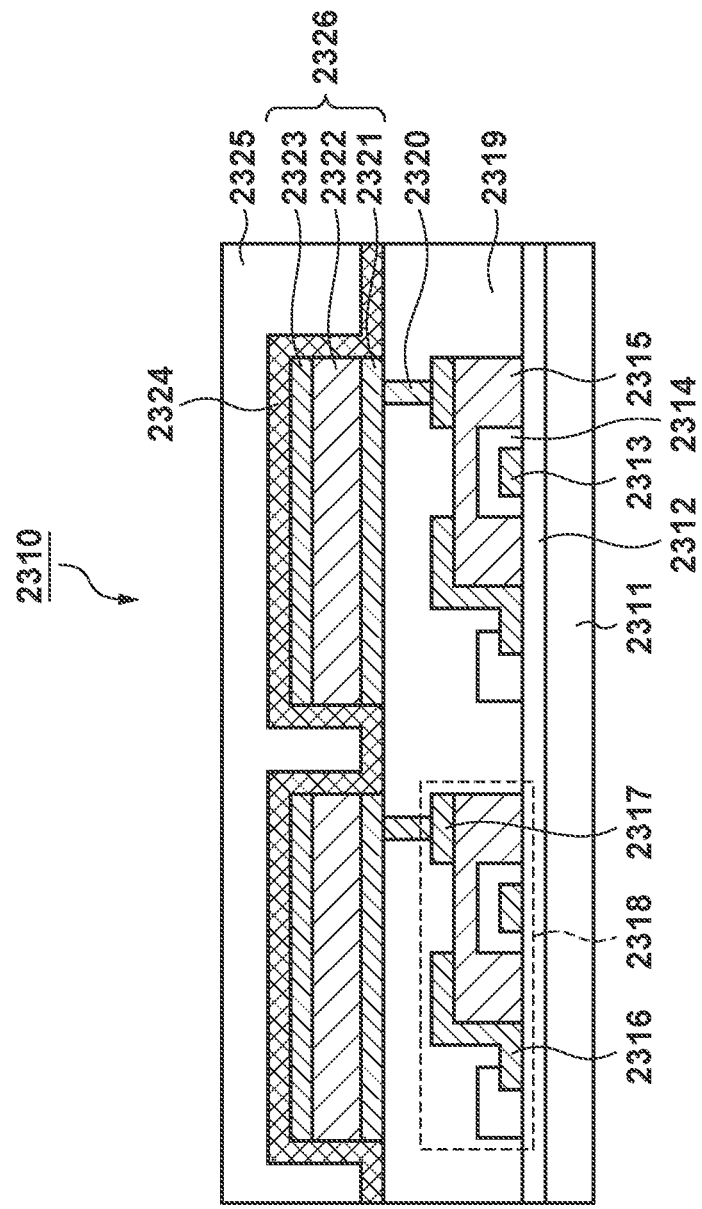
FIG. 11 is a sectional view showing an example of the arrangement of a light emitting device according to the embodiment.

Next, a light emitting device according to this embodiment will be described with reference to the accompanying drawings. FIG. 11 is a schematic sectional view showing an example of the organic device 100 including a light emitting element as an example of the above-described light emitting element 10 and a TFT element connected to the light emitting element. The TFT element is an example of an active element.

A light emitting device 2310 as an example of the organic device 100 shown in FIG. 11 is provided with a substrate 2311 of glass, silicon, or the like and an insulating layer 2312 thereon. An active element such as a TFT 2318 is arranged on the insulating layer 2312, and a gate electrode 2313, a gate insulating film 2314, and a semiconductor layer 2315 of the TFT 2318 are arranged. The TFT 2318 shown in FIG. 11 is an example of a driving circuit of a transistor. The TFT 2318 further includes the semiconductor layer 2315, a drain electrode 2316, and a source electrode 2317. An insulating film 2319 is provided on the TFT 2318. The source electrode 2317 and an anode 2321 forming the light emitting element are connected via a contact hole 2320 formed in the insulating film 2319.

Note that a method of electrically connecting the electrodes (anode and cathode) included in the light emitting element and the electrodes (source electrode and drain electrode) included in the TFT is not limited to the that shown in FIG. 11. That is, one of the anode and cathode and one of the source electrode and drain electrode of the TFT 2318 are electrically connected. The TFT indicates a thin-film transistor.

In the light emitting device 2310 shown in FIG. 11, an organic layer 2322 is illustrated as one layer. However, the organic layer 2322 may include a plurality of layers. Protective layers 2324 and 2325 are provided on a cathode 2323 to suppress the degradation of the light emitting element.

A transistor is used as a switching element in the light emitting device 2310 shown in FIG. 11 but may be used as another switching element.

The transistor used in the light emitting device 2310 shown in FIG. 11 is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that the thin-film transistor is also called a TFT element.

The transistor included in the light emitting device 2310 shown in FIG. 11 may be formed in a substrate such as an Si substrate. Here, being formed in a substrate means that a transistor is formed by processing the substrate itself such as an Si substrate. In other words, including a transistor in a substrate can be regarded as integrally forming the substrate and the transistor.

The light emission luminance of the light emitting element 10 according to this embodiment is controlled by the TFT which is an example of a switching element, and the light emitting elements are provided in a plurality of planes to display an image with the light emission luminances of the respective elements. Note that the switching element according to this embodiment is not limited to the TFT, and may be a transistor formed from low-temperature polysilicon or an active matrix driver formed on the substrate such as an Si substrate. The term "on the substrate" may mean "in the substrate". Whether to provide a transistor in the substrate or use a TFT is selected based on the size of the display unit. For example, if the size is about 0.5 inch, the organic light emitting element may be provided on the Si substrate.

Application examples in which the organic device 100 of each of the above-described embodiments is applied to a display device, a photoelectric conversion device, an electronic device, an illumination device, and a mobile device will be explained below with reference to FIGS. 12 to 17. That is, application examples of the organic device in a case in which the above-described organic layer 4 includes a light emitting layer will be described. In addition, the organic device 100 is applicable to the exposure light source of an electrophotographic image forming device, the backlight of a liquid crystal display device, a light emitting device including a color filter in a white light source, and the like. The display device may be an image information processing device that includes an image input unit for inputting image information from an area CCD, a linear CCD, a memory card, or the like, and an information processing unit for processing the input information, and displays the input image on a display unit. In addition, a display unit included in a camera or an inkjet printer may have a touch panel function. The driving type of the touch panel function may be an infrared type, a capacitance type, a resistive film type, or an electromagnetic induction type, and is not particularly limited. The display device may be used for the display unit of a multifunction printer.

Figure 12:
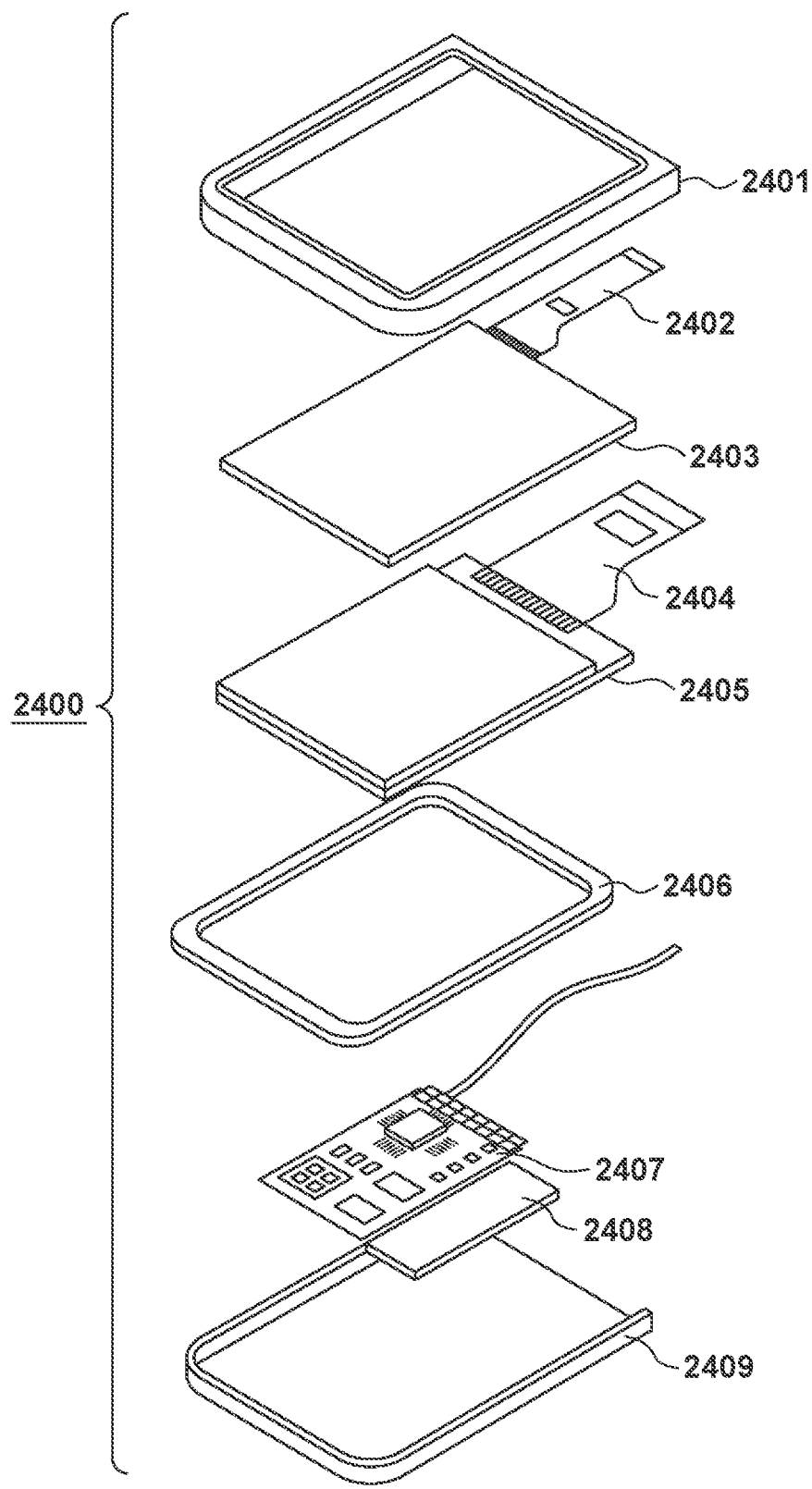
FIG. 12 is a view showing an example of a display device using the light emitting device according to the embodiment.

FIG. 12 is a schematic view showing an example of the display device using the organic device 100 according to this embodiment. A display device 2400 can include a touch panel 2403, a display panel 2405, a frame 2406, a circuit board 2407, and a battery 2408 between an upper cover 2401 and a lower cover 2409. Flexible printed circuits (FPCs) 2402 and 2404 are respectively connected to the touch panel 2403 and the display panel 2405. Active elements such as transistors are arranged on the circuit board 2407. The battery 2408 is unnecessary if the display device 2400 is not a portable device. Even when the display device 2400 is a portable device, the battery 2408 need not be provided in this position. The above-described organic device 100 in which the light emitting layer of the organic layer 4 contains an organic light emitting material such as an organic EL is applicable to the display panel 2405. The organic device 100 that functions as the display panel 2405 operates by being connected to the active elements such as transistors arranged on the circuit board 2407.

The display device 2400 shown in FIG. 12 may also be used as a display unit of a photoelectric conversion device (imaging device) including an optical unit having a plurality of lenses, and an imaging element for receiving light having passed through the optical unit and photoelectrically converting the light into an electrical signal. The photoelectric conversion device can have a display unit for displaying information acquired by the imaging element. In addition, the display unit can be either a display unit exposed outside the photoelectric conversion device, or a display unit arranged in the finder. The photoelectric conversion device may also be a digital camera or a digital video camera. In addition, the organic device 100, according to this embodiment, in which the function layer of the organic layer 4 includes a photoelectric conversion layer may be used as a photoelectric conversion element of a photoelectric conversion device.

Figure 13:
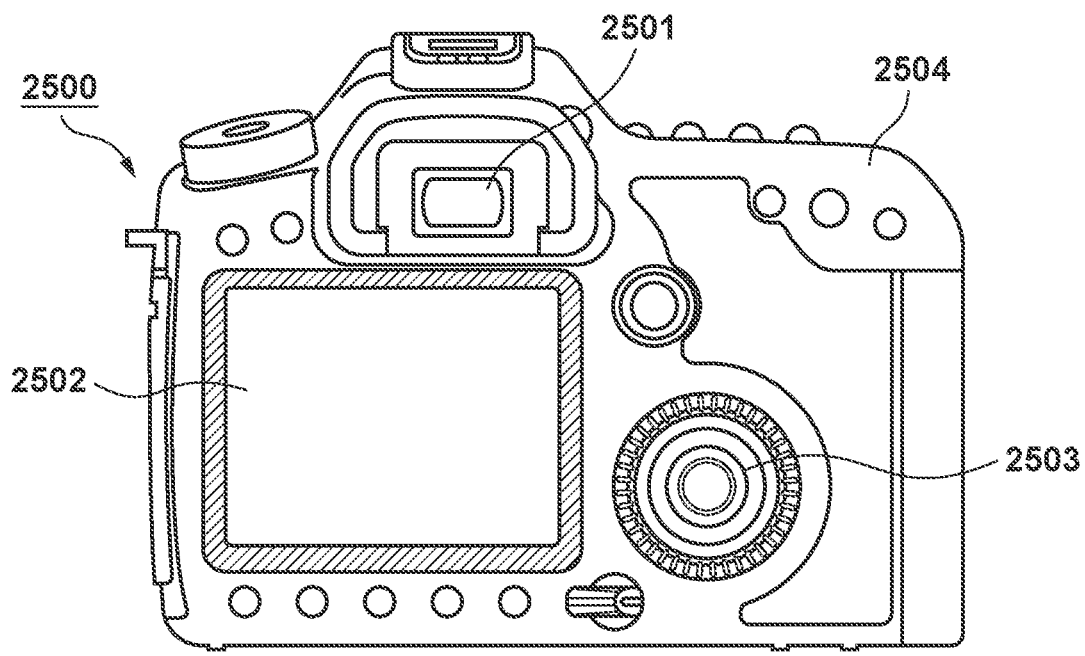
FIG. 13 is a view showing an example of a photoelectric conversion device using the light emitting device according to the embodiment.

FIG. 13 is a schematic view showing an example of the photoelectric conversion device using the organic device 100 according to this embodiment. A photoelectric conversion device 2500 can include a viewfinder 2501, a rear display 2502, an operation unit 2503, and a housing 2504. The photoelectric conversion device 2500 can also be referred to as an imaging device. The above-described organic device 100 in which the light emitting layer of the organic layer 4 contains the organic light emitting material is applicable to the viewfinder 2501 as a display unit. In this case, the organic device 100 can display not only an image to be captured but also environment information, imaging instructions, and the like. Examples of the environment information are the intensity and direction of external light, the moving velocity of an object, and the possibility that an object is covered with an obstacle.

The timing suitable for imaging is often a very short time, so the information is preferably displayed as soon as possible. Accordingly, the above-described organic device 100 in which the light emitting layer of the organic layer 4 contains the organic light emitting material can be used as the viewfinder 2501. This is so because the organic light emitting material has a high response speed. For the organic device 100 using the organic light emitting material, a display speed is obtained. The organic device 100 is more suitable for these devices than a liquid crystal display device.

The photoelectric conversion device 2500 includes an optical unit (not shown). This optical unit has a plurality of lenses, and forms an image of light having passed through the optical unit on a photoelectric conversion element (not shown) that is accommodated in the housing 2504 and receives the light. The focal points of the plurality of lenses can be adjusted by adjusting the relative positions. This operation can also automatically be performed.

The above-described organic device 100 in which the light emitting layer of the organic layer 4 contains the organic light emitting material may be applied to the display unit of the electronic device. At this time, the organic device 100 can have both a display function and an operation function. Examples of the portable terminal are a portable phone such as a smartphone, a tablet, and a head mounted display.

Figure 14:
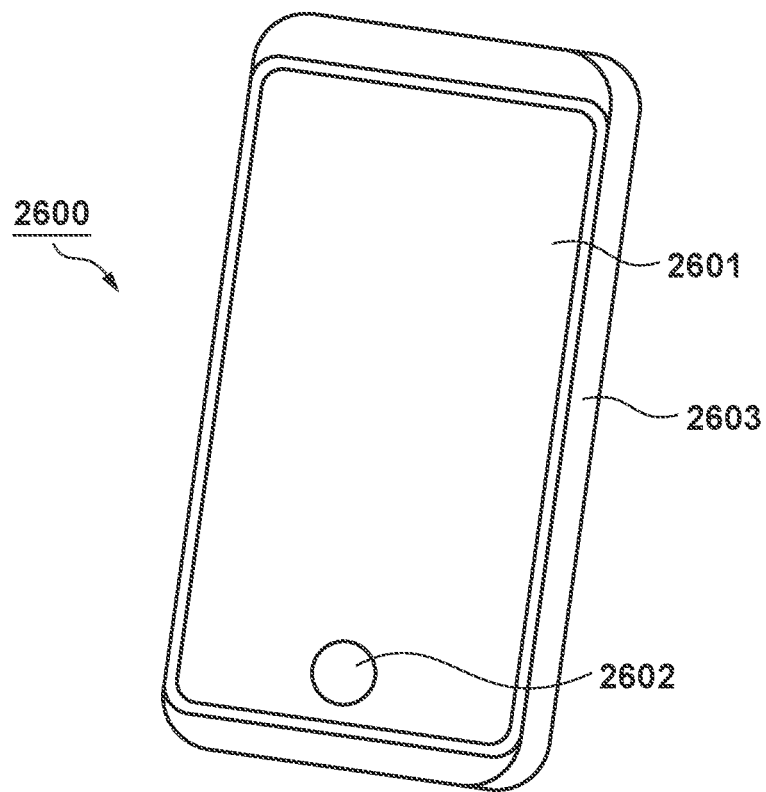
FIG. 14 is a view showing an example of an electronic device using the light emitting device according to the embodiment.

FIG. 14 is a schematic view showing an example of the electronic device using the organic device 100 according to this embodiment. An electronic device 2600 includes a display unit 2601, an operation unit 2602, and a housing 2603. The housing 2603 can accommodate a circuit, a printed board having this circuit, a battery, and a communication unit. The operation unit 2602 can be either a button or a touch-panel-type reaction unit. The operation unit 2602 can also be a biometric authentication unit that performs unlocking or the like by authenticating the fingerprint. A portable device including a communication unit can also be regarded as a communication device. The above-described organic device 100 in which the light emitting layer of the organic layer 4 contains the organic light emitting material is applicable to the display unit 2601.

Figure 15A:
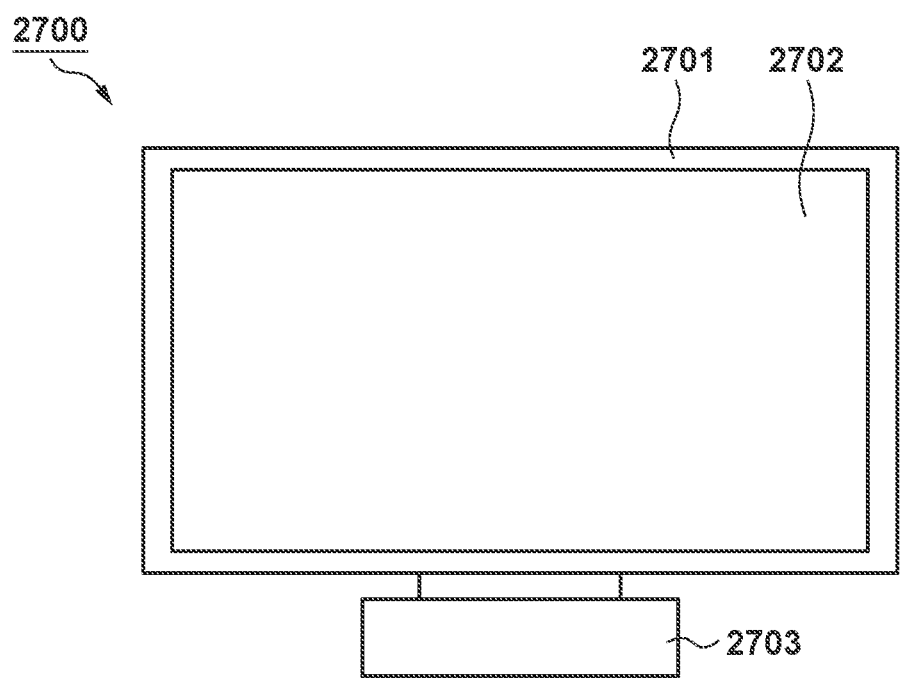
FIGS. 15A and 15B are views each showing an example of a display device using the light emitting device according to the embodiment.
Figure 15B:
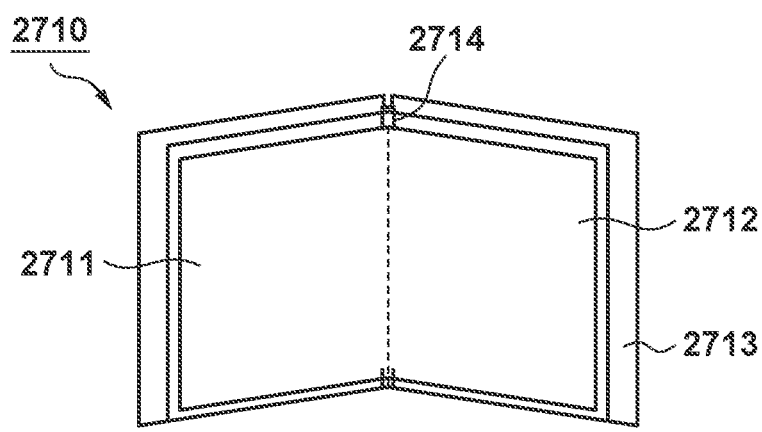

FIGS. 15A and 15B are schematic views showing examples of the display device using the organic device 100 according to this embodiment. FIG. 15A shows a display device such as a television monitor or a PC monitor. A display device 2700 includes a frame 2701 and a display unit 2702. The above-described organic device 100 in which the light emitting layer of the organic layer 4 contains the organic light emitting material is applicable to the display unit 2702. The display device 2700 may also include a base 2703 that supports the frame 2701 and the display unit 2702. The base 2703 is not limited to the form shown in FIG. 15A. For example, the lower side of the frame 2701 may also function as the base 2703. In addition, the frame 2701 and the display unit 2702 can be bent. The radius of curvature in this case can be 5,000 mm or more to 6,000 mm or less.

FIG. 15B is a schematic view showing another example of the display device using the organic device 100 according to this embodiment. A display device 2710 shown in FIG. 15B can be folded, that is, the display device 2710 is a so-called foldable display device. The display device 2710 includes a first display unit 2711, a second display unit 2712, a housing 2713, and a bending point 2714. The above-described organic device 100 in which the light emitting layer of the organic layer 4 contains the organic light emitting material is applicable to each of the first display unit 2711 and the second display unit 2712. The first display unit 2711 and the second display unit 2712 can also be one seamless display device. The first display unit 2711 and the second display unit 2712 can be divided by the bending point. The first display unit 2711 and the second display unit 2712 can display different images, and can also display one image together.

Figure 16:
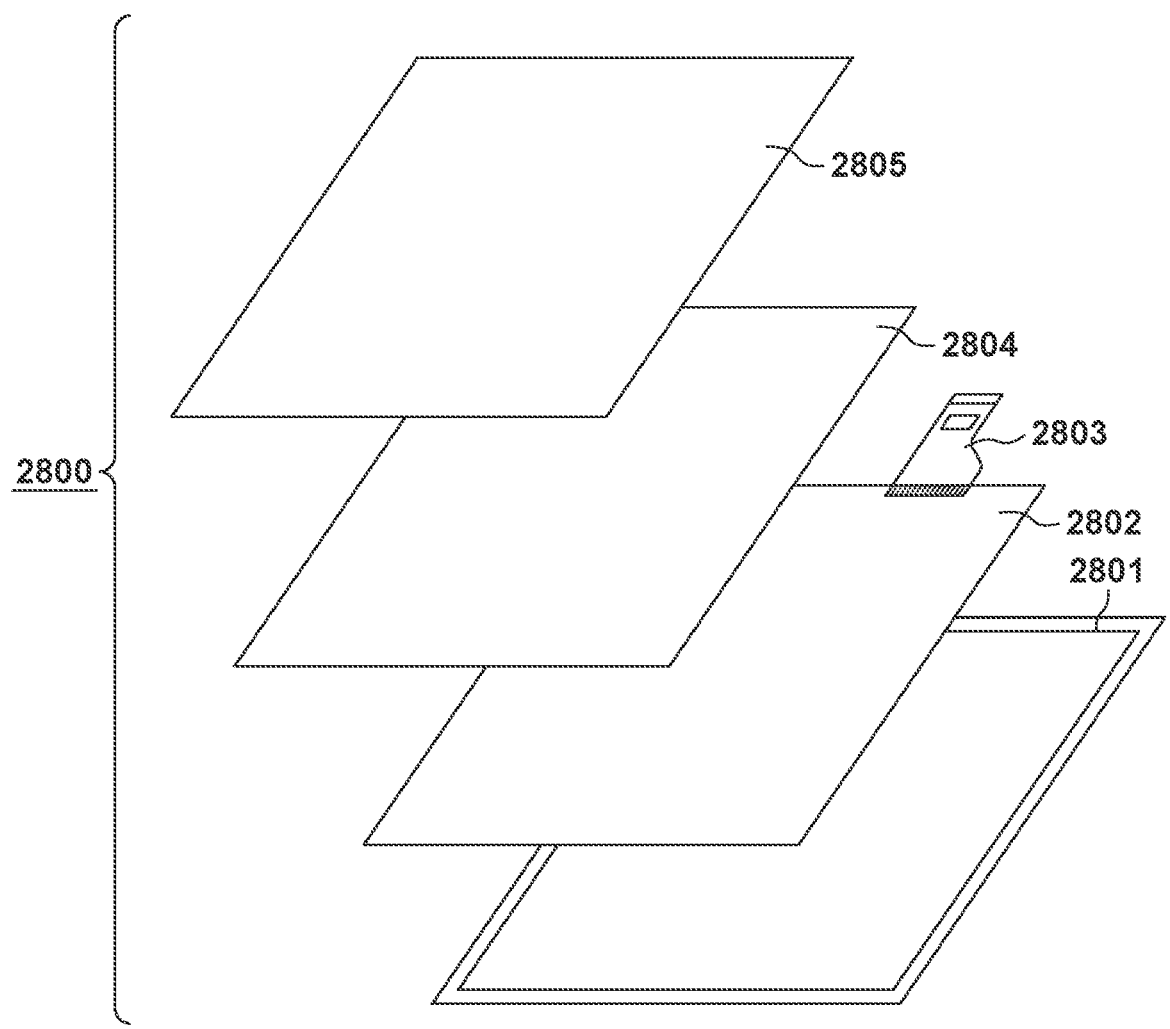
FIG. 16 is a view showing an example of an illumination device using the light emitting device according to the embodiment.

FIG. 16 is a schematic view showing an example of the illumination device using the organic device 100 according to this embodiment. An illumination device 2800 can include a housing 2801, a light source 2802, a circuit board 2803, an optical film 2804, and a light diffusing unit 2805. The above-described organic device 100 in which the light emitting layer of the organic layer 4 contains the organic light emitting material is applicable to the light source 2802. The optical film 2804 can be a filter that improves the color rendering of the light source. When performing lighting-up or the like, the light diffusing unit 2805 can throw the light of the light source over a broad range by effectively diffusing the light. The illumination device 2800 can also include a cover on the outermost portion, as needed. The illumination device 2800 can include both the optical film 2804 and the light diffusing unit 2805, and can also include only one of them.

The illumination device 2800 is a device for illuminating the room or the like. The illumination device 2800 can emit white light, natural white light, or light of any color from blue to red. The illumination device 2800 can also include a light control circuit for controlling these light components. The illumination device 2800 can also include a power supply circuit to be connected to the organic device 100 that functions as the light source 2802. This power supply circuit can be a circuit for converting an AC voltage into a DC voltage. "White" has a color temperature of 4,200 K, and "natural white" has a color temperature of 5,000 K. The illumination device 2800 may also have a color filter. In addition, the illumination device 2800 can have a heat radiation unit. The heat radiation unit radiates the internal heat of the device to the outside of the device, and examples are a metal having a high specific heat and liquid silicon.

Figure 17:
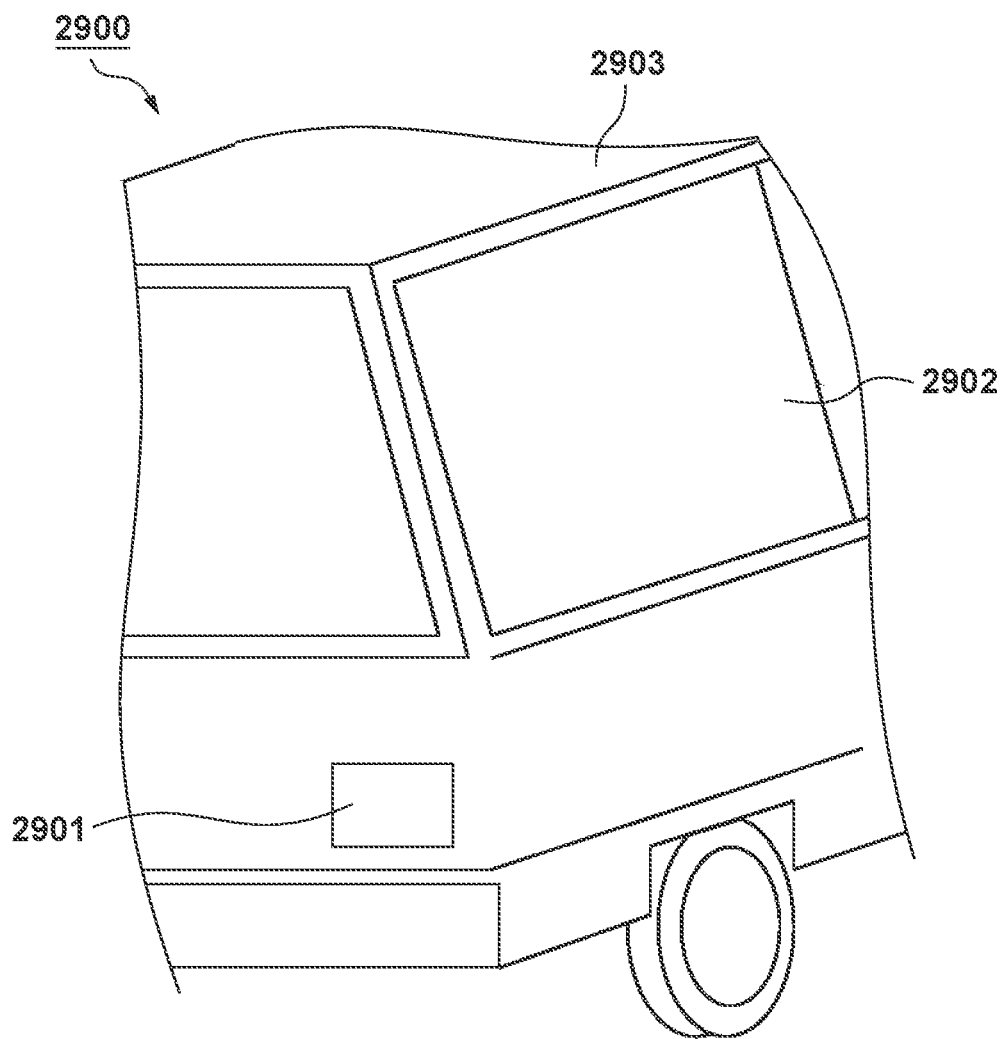
FIG. 17 is a view showing an example of a mobile device using the light emitting device according to the embodiment.

FIG. 17 is a schematic view of an automobile including a taillight as an example of a vehicle lighting appliance using the organic device 100 according to this embodiment. An automobile 2900 has a taillight 2901, and the taillight 2901 may be turned on when performing a braking operation or the like. The organic device 100 according to this embodiment may be used as a headlight serving as a vehicle lighting appliance. The automobile is an example of a mobile device, and the mobile device may be a ship, a drone, an airplane, a railway vehicle, or the like. The mobile device can include a main body and a mobile device lighting appliance installed in the main body. The lighting appliance may also be a device that sends a notification of the current position of the main body.

The above-described organic device 100 in which the light emitting layer of the organic layer 4 contains the organic light emitting material is applicable to the taillight 2901. The taillight 2901 can have a protection member for protecting the organic device 100 that functions as the taillight 2901. The material of the protection member is not limited as long as the material is a transparent material with a strength that is high to some extent, and can be polycarbonate. The protection member can also be formed by mixing a furandicarboxylic acid derivative or an acrylonitrile derivative in polycarbonate.

The automobile 2900 can include a body 2903, and a window 2902 attached to the body 2903. This window can be a window for checking the front and back of the automobile, and can also be a transparent display. The above-described organic device 100 in which the light emitting layer of the organic layer 4 contains the organic light emitting material can be used as this transparent display. In this case, the constituent materials such as the electrodes of the organic device 100 are formed by transparent members.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-118736, filed Jul. 9, 2020, which is hereby incorporated by reference herein in its entirety.

What is claimed is:

1. An organic device, comprising:
a substrate;
a first electrode and a second electrode arranged directly above a main surface of the substrate;
an insulating layer that includes a first portion arranged between the first electrode and the second electrode, and a second portion arranged to cover a peripheral portion of the first electrode;
an organic layer including a plurality of function layers and a charge generating layer arranged between the plurality of function layers, the organic layer being arranged directly above the first electrode, the second electrode and the insulating layer; and
a third electrode arranged directly above the organic layer, wherein
the first electrode has a third portion that is not covered by the insulating layer,
an upper surface of the insulating layer includes a slope portion between a vertex portion of the second portion and the first portion, the slope portion having an angle with respect to a surface parallel to the main surface that is greater than 50° to less than 180°,
the vertex portion is farthest from the main surface in the upper surface,
an upper end of the slope portion is closer to the main surface than an upper surface of a fourth portion of the organic layer that is directly above the first portion, the upper surface of the fourth portion is closest to the main surface in the surface of the organic layer that is directly above the first portion, the upper end of the slope portion is farther from the main surface than an upper surface of a fifth portion of the charge generating layer, the upper surface of the fifth portion is closest to the main surface in the upper surface of the charge generating layer that is directly above the first portion.

2. The device according to claim 1, wherein the organic layer includes a plurality of charge generating layers, and the upper end of the slope portion is farther from the main surface than an upper surface of any of the plurality of charge generating layers directly above at least one of the first portion and the third portion.

3. The device according to claim 1, wherein the organic layer further includes a charge transport layer arranged between the charge generating layer and the third electrode, and the upper end of the slope portion is farther from the main surface than an upper surface of the charge transport layer directly above at least one of the first portion and the third portion.

4. The device according to claim 3, wherein the charge transport layer is a hole transport layer.

5. The device according to claim 3, wherein the charge transport layer contacts the upper surface of the charge generating layer.

6. The device according to claim 1, wherein the angle of the slope portion is greater than 50° to not more than 90° with respect to the surface parallel to the main surface.

7. The device according to claim 1, wherein the upper surface of the insulating layer that is between the vertex portion and at least one of the first portion and the third portion further includes a gentle slope portion that has an angle that is 0° to 50° with respect to the surface parallel to the main surface.

8. The device according to claim 7, wherein the gentle slope portion is arranged between the vertex portion and the slope portion.

9. The device according to claim 1, wherein D/C<50, where C is a thickness of the organic layer on at least one of the first portion and the third portion, and D is a distance between the third portion and a portion of the second electrode that is not covered by the insulating layer.

10. The device according to claim 1, further comprising a plurality of lower electrodes which include the first electrode and the second electrode, wherein the first electrode and the second electrode are adjacent to each other.

11. The device according to claim 1, wherein the third portion is farther from the main surface than the first portion.

12. The device according to claim 1, further comprising an optical adjustment layer between the first electrode and the main surface, wherein the first portion is arranged on the optical adjustment layer, and a sixth portion that is closer to the main surface than the first portion is arranged between the first portion and the second electrode.

13. The device according to claim 12, wherein the upper surface of the insulating layer between the first portion and the sixth portion includes another slope portion different from the slope portion that has an angle with respect to the surface parallel to the main surface that is greater than 50° to less than 180°, and an upper end of the other slope portion is farther from the main surface than the upper surface of the charge generating layer on the sixth portion, and is closer to the main surface than the upper surface of the organic layer on the sixth portion.

14. The device according to claim 12, comprising another optical adjustment layer that has a film thickness that is smaller than a film thickness of the optical adjustment layer arranged between the second electrode and the main surface.

15. The device according to claim 12, wherein the optical adjustment layer is not arranged between the second electrode and the main surface.

16. The device according to claim 1, wherein the plurality of function layers includes one selected from the group consisting of a light emitting layer and a photoelectric conversion layer.

17. The device according to claim 1, wherein the plurality of function layers includes a light emitting layer, each of the first electrode and the second electrode is a reflective electrode configured to reflect light emitted by the light emitting layer, and the third electrode is a light-transmissive electrode configured to transmit light emitted by the light emitting layer, and a distance L from the first electrode and the second electrode to the third electrode satisfies $(\lambda/8)\times(-(2\varphi/\pi)-1)<L<(\lambda/8)\times(-(2\varphi/\pi)+1)$, where $\lambda$ is a maximum peak wavelength of an emitted light spectrum of light emitted by the light emitting layer, and $\varphi$ is a phase shift in the first electrode and the second electrode.

18. A display device, comprising:
the organic device according to claim 1; and
an active element connected to the organic device.

19. A photoelectric conversion device, comprising:
an optical unit that includes a plurality of lenses;
an image capturing element configured to receive light that passed through the optical unit; and
a display unit configured to display an image, wherein
the display unit is configured to display an image captured by the image capturing element and includes the organic device according to claim 1.

20. An electronic device, comprising:
a housing in which a display unit is arranged; and
a communication unit configured to communicate with an external device,
wherein the display unit includes the organic device according to claim 1.

21. An illumination device, comprising:
a light source; and
at least one of a light diffusing unit and an optical film, wherein
the light source includes the organic device according to claim 1.

22. A mobile device lighting appliance, comprising:
the organic device according to claim 1; and
a protective member configured to protect the organic device.

23. A mobile device, comprising:
a body; and
a lighting appliance arranged on the body, wherein
the lighting appliance includes the organic device according to claim 1.

* * * * *